(12) United States Patent
Jo

(10) Patent No.: US 10,364,966 B2
(45) Date of Patent: Jul. 30, 2019

(54) LAMP INCLUDING A MICRO-LED ARRAY FOR VEHICLE AND VEHICLE HAVING THE SAME

(71) Applicant: LG Electronics Inc., Seoul (KR)

(72) Inventor: Juung Jo, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 15/856,242

(22) Filed: Dec. 28, 2017

(65) Prior Publication Data

US 2019/0003688 A1 Jan. 3, 2019

(30) Foreign Application Priority Data

Jun. 30, 2017 (KR) .................... 10-2017-0083633

(51) Int. Cl.
| | |
|---|---|
| *F21V 19/00* | (2006.01) |
| *F21S 41/20* | (2018.01) |
| *F21S 41/147* | (2018.01) |
| *F21S 41/19* | (2018.01) |
| *F21V 23/00* | (2015.01) |

(Continued)

(52) U.S. Cl.
CPC .......... *F21V 19/003* (2013.01); *F21S 41/147* (2018.01); *F21S 41/151* (2018.01); *F21S 41/153* (2018.01); *F21S 41/19* (2018.01); *F21S 41/285* (2018.01); *F21S 43/14* (2018.01); *F21S 43/19* (2018.01); *F21S 43/26* (2018.01); *F21S 45/47* (2018.01); *F21V 23/001* (2013.01); *F21V 29/80* (2015.01); *F21S 41/176* (2018.01); *F21S 43/16* (2018.01); *F21W 2107/10* (2018.01);

(Continued)

(58) Field of Classification Search
CPC ...... F21V 19/003; F21V 23/001; F21V 29/80; F21S 43/14; F21S 41/147; F21S 41/19; F21S 43/26; F21S 43/19; F21S 41/285; F21S 45/47; F21S 41/151; F21S 41/176; F21S 43/16; H01L 25/0753; H01L 25/0756; F21Y 2115/10; F21W 2107/10
See application file for complete search history.

(56) References Cited

U.S. PATENT DOCUMENTS 6,299,337 B1 * 10/2001 Bachl .................... H01L 25/13
362/545
2007/0171650 A1 * 7/2007 Ishida .................. F21S 41/147
362/307

(Continued)

FOREIGN PATENT DOCUMENTS

| DE | 19922176 | 11/2000 |
|---|---|---|
| EP | 2671756 | 12/2013 |

(Continued)

OTHER PUBLICATIONS

Sano, JP2002043771, Aug. 2002, machine translation.*
European Search Report dated Nov. 9, 2018; on European Patent appl. No. 18179041.1, 8 pages.

*Primary Examiner* — Tracie Y Green
(74) *Attorney, Agent, or Firm* — Fish & Richardson P.C.

(57) ABSTRACT

A lamp for a vehicle includes a light generation unit, a bracket, and a lens configured to change an optical path of light generated by the light generation unit. The light generation unit includes a light array including a plurality of micro Light Emitting Diode (LED) chips, and the light array includes a bent portion that covers at least a part of the bracket.

19 Claims, 25 Drawing Sheets

(51) Int. Cl.
- *F21V 29/80* (2015.01)
- *F21S 45/47* (2018.01)
- *F21S 41/153* (2018.01)
- *F21S 43/14* (2018.01)
- *F21S 43/19* (2018.01)
- *F21S 41/151* (2018.01)
- *F21S 43/20* (2018.01)
- *F21Y 107/20* (2016.01)
- *F21Y 115/10* (2016.01)
- *F21S 41/176* (2018.01)
- *F21S 43/16* (2018.01)
- *F21W 107/10* (2018.01)
- *H01L 25/075* (2006.01)

(52) U.S. Cl.
CPC ....... *F21Y 2107/20* (2016.08); *F21Y 2115/10* (2016.08); *H01L 25/0753* (2013.01); *H01L 25/0756* (2013.01)

(56) References Cited

U.S. PATENT DOCUMENTS

| | | |
|---|---|---|
| 2009/0273282 A1* | 11/2009 | Ballard .............. B60Q 1/2607 315/77 |
| 2013/0016494 A1 | 1/2013 | Speier et al. |
| 2013/0062631 A1 | 3/2013 | Liu |
| 2013/0329444 A1* | 12/2013 | Oh .................. F21V 21/00 362/543 |
| 2015/0003083 A1 | 1/2015 | Uehara |
| 2018/0132330 A1* | 5/2018 | Chong .............. H05B 33/0857 |
| 2018/0172234 A1* | 6/2018 | Kim .................. F21V 29/70 |
| 2018/0259570 A1* | 9/2018 | Henley .............. G01R 31/00 |

FOREIGN PATENT DOCUMENTS

| | | | |
|---|---|---|---|
| EP | 3034932 | | 6/2016 |
| GB | 2530307 | | 3/2016 |
| JP | 2002043771 | A | 2/2002 |
| JP | 2013054849 | A | 3/2013 |
| KR | 1397604 | A | 5/2014 |
| KR | 2015-084016 | * | 6/2015 |

* cited by examiner

FIG. 1
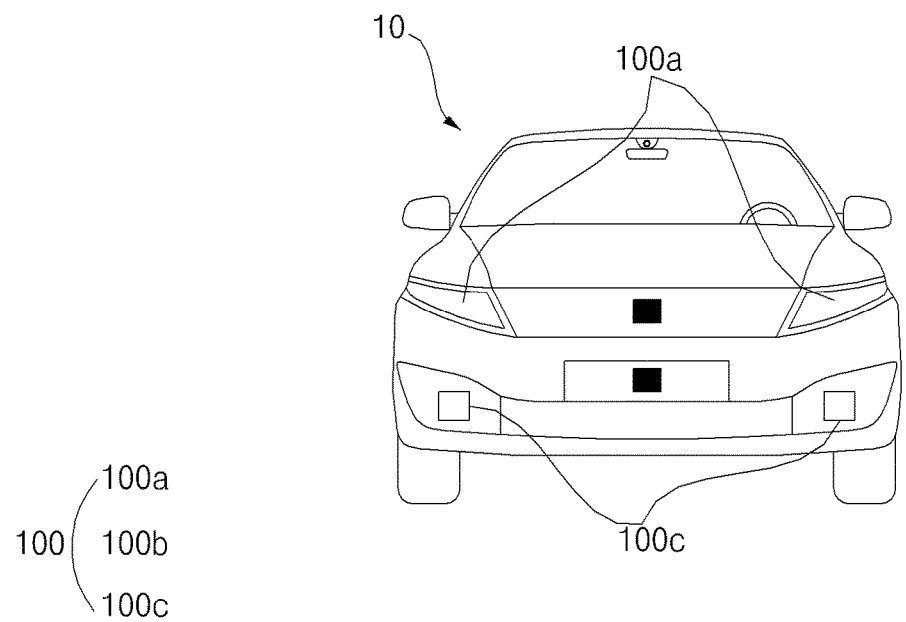
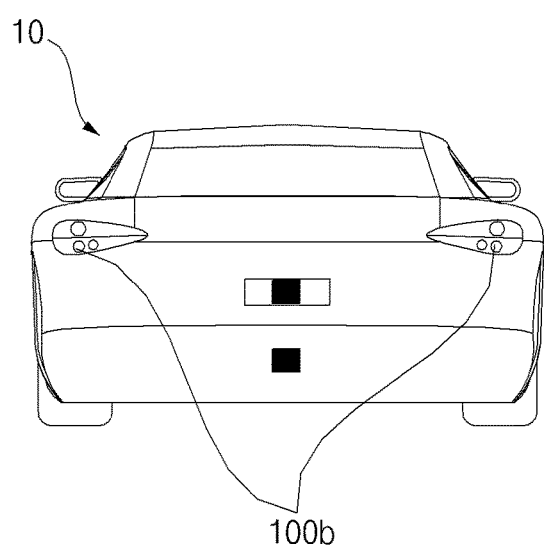

200

FIG. 10A
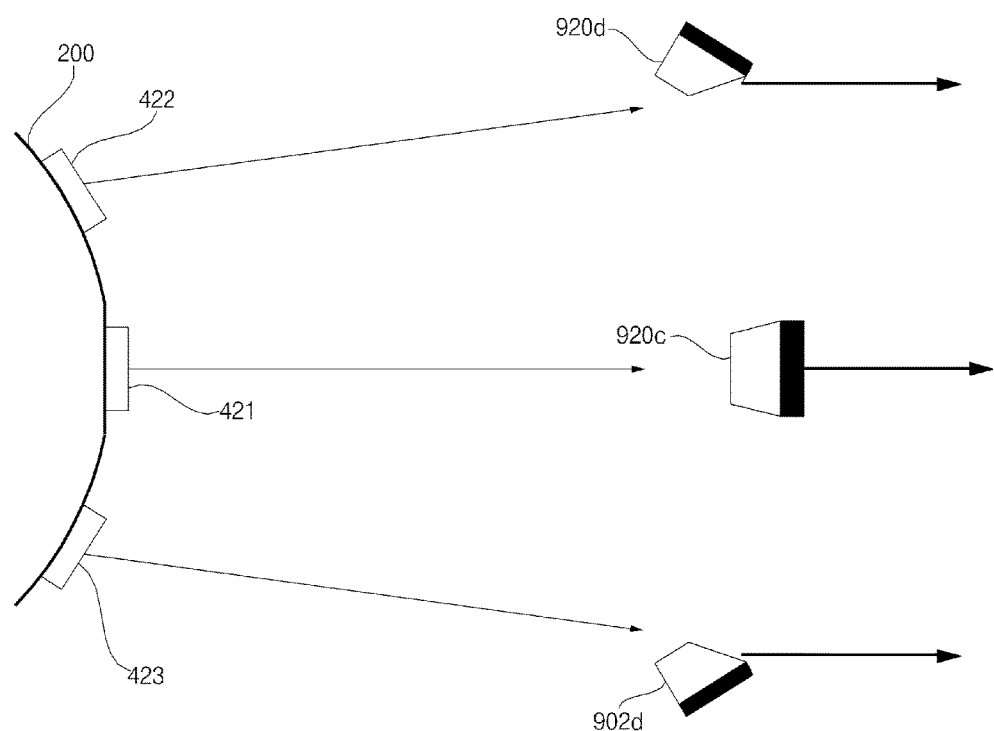
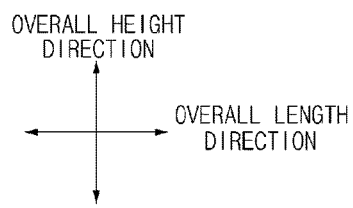

FIG. 11A
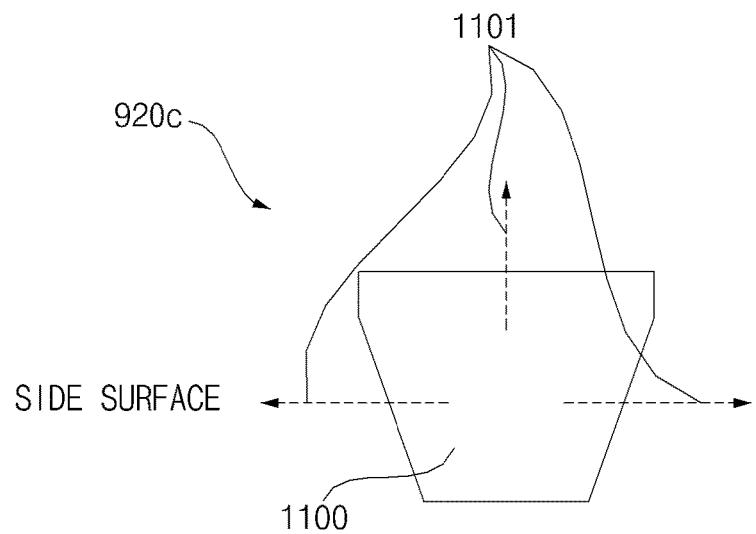
SIDE SURFACE
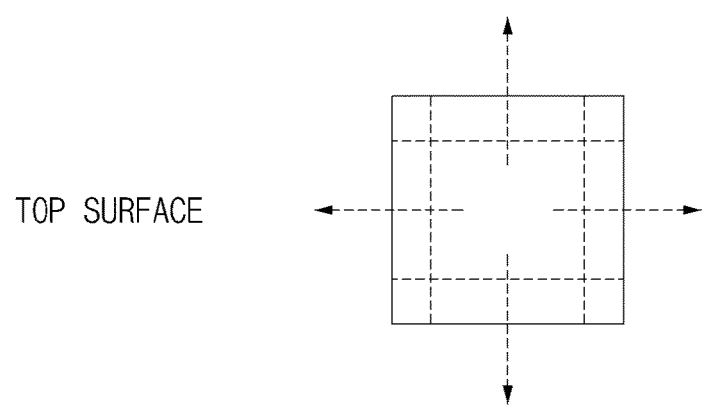
TOP SURFACE

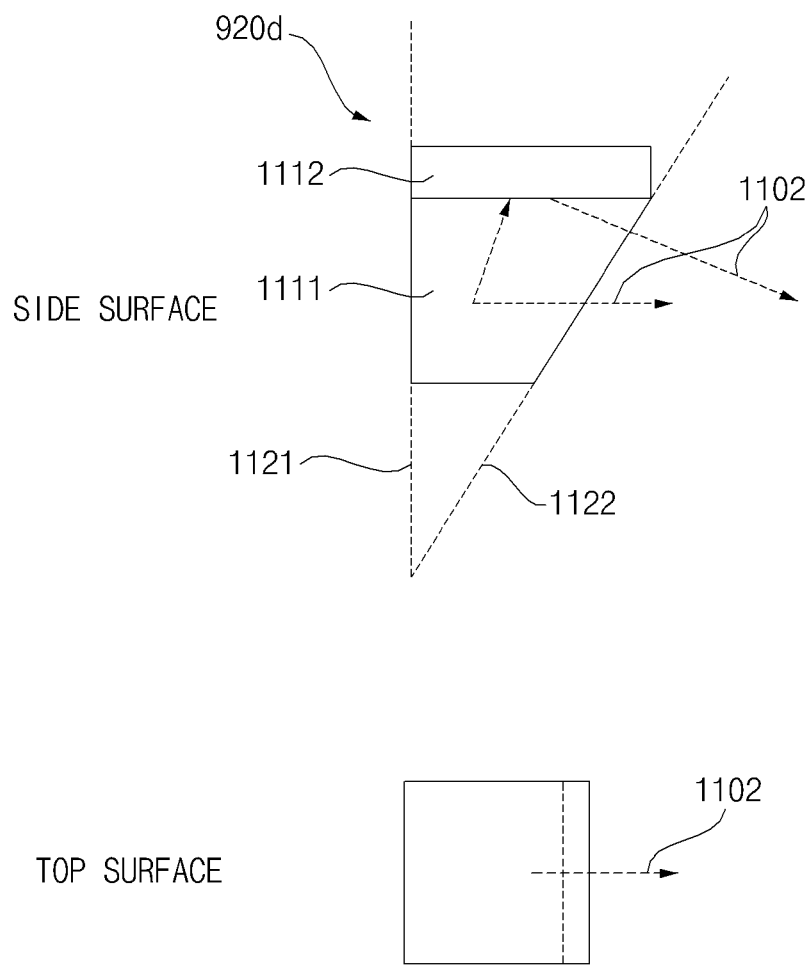

FIG. 11C
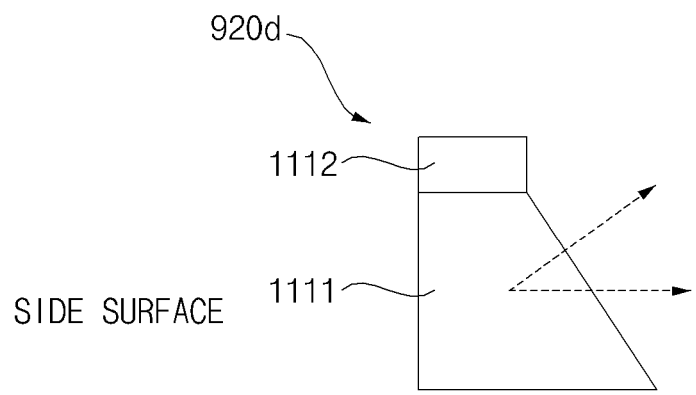
SIDE SURFACE
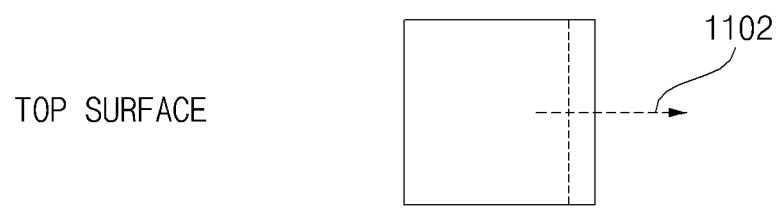
TOP SURFACE

FIG. 12A
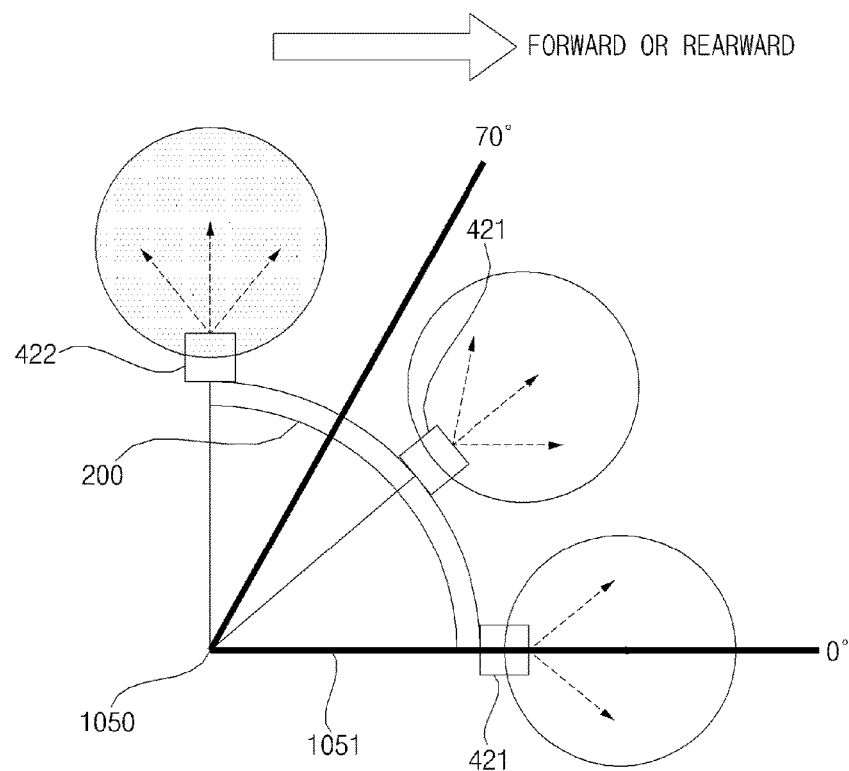
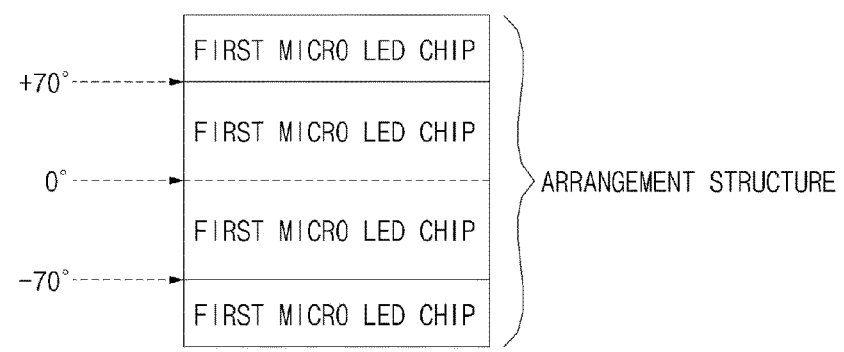

FIG. 12B
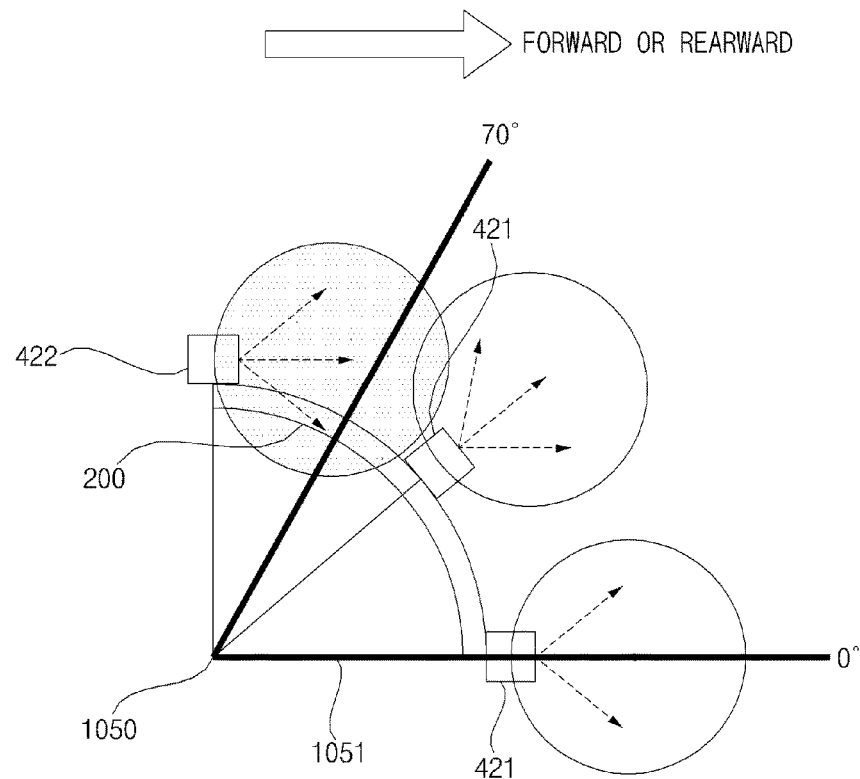
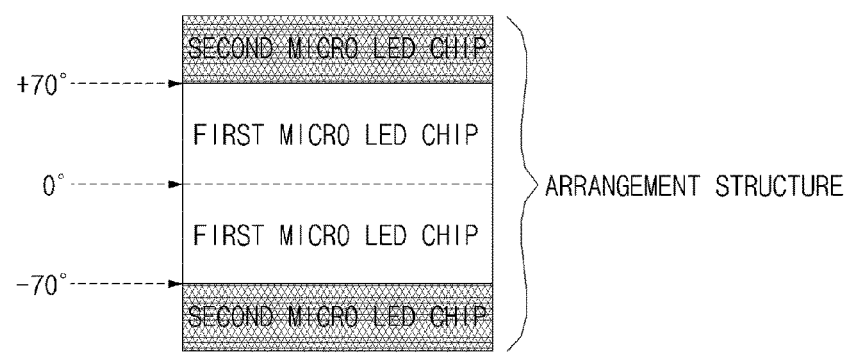

FIG. 17
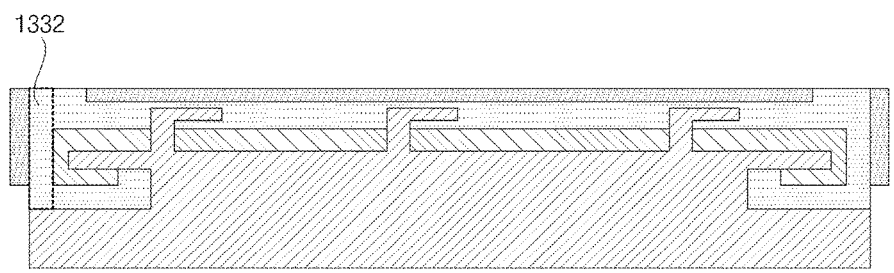
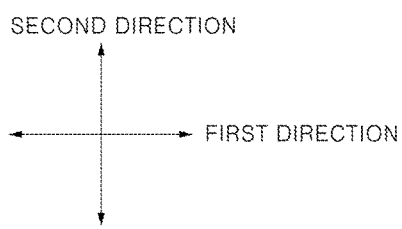

LAMP INCLUDING A MICRO-LED ARRAY FOR VEHICLE AND VEHICLE HAVING THE SAME

CROSS-REFERENCE TO RELATED APPLICATION

This application claims the priority benefit of Korean Patent Application No. 10-2017-0083633, filed on Jun. 30, 2017, in the Korean Intellectual Property Office, the disclosure of which is incorporated herein by reference.

FIELD

The present disclosure relates to a lamp for vehicle, and a vehicle including a lamp.

BACKGROUND

A vehicle is an apparatus that can ride a user in a direction. An example of a vehicle may be an automobile.

The vehicle may include lamps. For example, the vehicle includes a head lamp, a rear combination lamp, and a fog lamp.

The lamps for a vehicle may be classified as lamps for providing visibility for a driver (e.g., a head lamp and a fog lamp), and lamps for notifying a simple signal (e.g., a rear combination lamp).

In some examples, a microchip (a "chip") or a small electronic device may be used as light sources of the lamps in a vehicle.

Recently, there have been efforts to utilize a plurality of micro Light Emitting Diode (LED) chips as light sources of the lamps for a vehicle.

In some examples where unit arrays including a plurality of micro LED chips are used as a light source of a vehicle lamp, it may be necessary to study and research a structure for fixing the unit arrays.

SUMMARY

One object of the present disclosure may be to provide a lamp for a vehicle, which has an array including a plurality of micro Light Emitting Diode (LED) chips that are coupled to a bracket.

Another object of the present disclosure may be to provide a vehicle including the lamp.

Objects of the present disclosure should not be limited to the aforementioned objects and other unmentioned objects will be clearly understood by those skilled in the art from the following description.

According to one aspect of the subject of matter described in this application, a lamp for a vehicle includes a light generation unit, a bracket, and a lens configured to change an optical path of light generated by the light generation unit. The light generation unit includes a light array including a plurality of micro Light Emitting Diode (LED) chips, and the light array includes a bent portion that covers at least a part of the bracket.

Implementations according to this aspect may include one or more of the following features. For example, the light array may be configured to flex. The light array may include a first region that includes the plurality of micro LED chips, and a second region that does not include the plurality of micro LED chips, where at least a portion of the second region has a bent shape. The bracket may include a base, and a holder that extends from the base toward the light array and that is configured to fix the light array to the holder. The holder may include one or more bent portions. The holder may extend from the base in a direction that forms an acute angle with respect to a surface of the base.

In some examples, the light array may include a bent region having a preset curvature, and the holder may be disposed at a location corresponding to the bent region of the light array. The lamp may further include an adhesive member configured to couple the light array to the bracket. The at least a portion of the bracket may contact the light array. The lamp may further include a wire configured to supply electrical energy to the light array, and the wire contacts the at least a portion of the bracket. In some cases, the light array may include at least one bent portion that is connected to the wire.

In some implementations, the lamp may further include a heat dissipation device that contacts at least a portion of the bracket and that is configured to dissipate heat generated from the light array. The heat dissipation device may include a plurality of dissipation pins that penetrates the bracket to thereby contact the light array. The lamp may further include a housing that defines an exterior of the lamp, and the plurality of dissipation pins may be exposed to an outside of the housing.

In some implementations, the light array may include a plurality of portions to cover the at least a part of the bracket. For example, the plurality of portions of the light array may include a first flat portion that extends in a first direction, and a first bent portion that extends from the first flat portion in a second direction. In some examples, the light array may further include a second flat portion that extends from the first bent portion in the second direction, and a second bent portion that extends from the second flat portion in the first direction. The light array may further include a third flat portion that extends from the second bent portion in the first direction, and a third bent portion that extends from the third flat portion in the second direction. In some examples, the second flat portion includes a portion of the plurality of micro LED chips.

In some implementations, the lamp may further include a supporting structure that contacts the bracket and that is configured to provide pressure to the bracket toward the light array. In some examples, the lamp may further include a wire configured to supply electrical energy to the light array, and the wire may penetrate the bracket and the supporting structure.

The details of other implementations are included in the following description and the accompanying drawings.

The implementations of the present disclosure have one or more effects as follows.

First, a bracket may fix a flexible array.

Second, a heat dissipation system may make it possible to dissipate heat generated from the plurality of micro LED chips.

Third, as a supporting structure presses the bracket, the array may contact with the bracket.

Effects of the present disclosure should not be limited to the aforementioned effects and other unmentioned effects will be clearly understood by those skilled in the art from the claims.

BRIEF DESCRIPTION OF THE DRAWINGS

FIG. 1 is a diagram illustrating example exterior appearance of an example vehicle.

FIGS. 10A and 10B are schematic views of an array and micro LED chips.

FIGS. 11A to 11C are diagrams illustrating example shapes of an example plurality of micro LED chips.

FIGS. 12A and 12B are diagrams illustrating an example plurality of groups of micro LED chips disposed in an example array.

FIG. 17 is a diagram illustrating an example array and an example bracket of a lamp for a vehicle.

DETAILED DESCRIPTION

Figure 2:
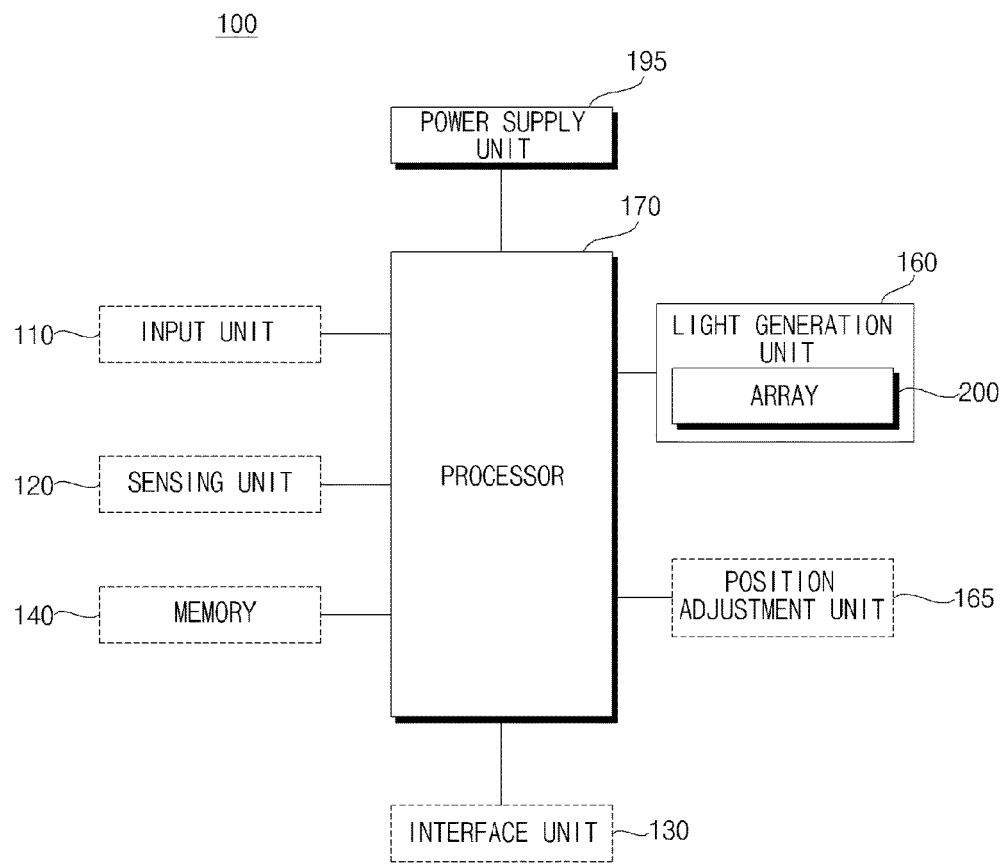
FIG. 2 is a block diagram of an example lamp for a vehicle.

The implementations disclosed in the present specification will be described in detail with reference to the accompanying drawings, and the same or similar elements are denoted by the same reference numerals even though they are depicted in different drawings and redundant descriptions thereof will be omitted.

A vehicle as described in this specification may include an automobile, a motorcycle, and other types of vehicles. Hereinafter, a description will be given based on an automobile.

A vehicle as described in this specification may include all of an internal combustion engine vehicle including an engine as a power source, a hybrid vehicle including both an engine and an electric motor as a power source, and an electric vehicle including an electric motor as a power source.

In the following description, "the left side of the vehicle" refers to the left side in the forward driving direction of the vehicle, and "the right side of the vehicle" refers to the right side in the forward driving direction of the vehicle.

FIG. 1 is a diagram illustrating an example exterior appearance of an example vehicle.

Referring to FIG. 1, a vehicle 10 may include a lamp 100 for vehicle.

The lamp 100 may include a head lamp 100a, a rear combination lamp 100b, and a fog lamp 100c.

The lamp 100 may further include a room lamp, a turn signal lamp, a daytime running lamp, a back lamp, and a positioning lamp.

The term "overall length" means the length from the front end to the rear end of the vehicle 10, the term "overall width" means the width of the vehicle 10, and the term "overall height" means the height from the bottom of the wheel to the roof. In the following description, the term "overall length direction L" may mean the reference direction for the measurement of the overall length of the vehicle 10, the term "overall width direction W" may mean the reference direction for the measurement of the overall width of the vehicle 10, and the term "overall height direction H" may mean the reference direction for the measurement of the overall height of the vehicle 10.

FIG. 2 is a block diagram illustrating an example lamp for a vehicle.

Referring to FIG. 2, the lamp 100 may include a light generation unit 160, a processor 170, and a power supply unit 190.

The lamp 100 may further include an input unit 110, a sensing unit 120, an interface unit 130, a memory 140, and a position adjustment unit 165 individually or in combination.

The input unit 110 may receive a user input for controlling the lamp 100.

The input unit 110 may include one or more input devices. For example, the input unit 110 may include one or more of a touch input device, a mechanical input device, a gesture input device, and a voice input device.

The input unit 110 may receive a user input for controlling operation of the light generation unit 160.

For example, the input unit 110 may receive a user input for controlling turning on or off of the light generation unit 160.

The sensing unit 120 may include one or more sensors.

For example, the sensing unit 120 may include a temperature sensor or an illumination sensor.

The sensing unit 120 may acquire temperature information of the light generation unit 160.

The sensing unit 120 may acquire external illumination information of the vehicle 10.

The interface unit 130 may exchange information, data, or a signal with another device provided in the vehicle 10.

The interface unit 130 may transmit information, data, or a signal, received from another device provided in the vehicle 10, to the processor 170.

The interface unit 130 may transmit information, data, or a signal, generated by the processor 170, to another device provided in the vehicle 10.

The interface unit 130 may receive driving situation information.

The driving situation information may include at least one of: information on an object located outside of the vehicle 10, navigation information, or vehicle state information.

The information on an object located outside of the vehicle 10 may include: information on the presence of the object, information on a location of the object, information on movement of the object, information on a distance between the vehicle 10 and the object, information on a speed of the vehicle 10 relative to the object, and information on a type of the object.

The object information may be generated by an object detection apparatus provided in the vehicle 10. The object detection apparatus may detect an object based on sensing data generated by one or more sensors of: a camera, a Radio Detection And Ranging (RADAR) sensor, a Light Detection And Ranging (LIDAR) sensor, an ultrasonic sensor, and an infrared sensor.

The object may include a line, a nearby vehicle, a pedestrian, a two-wheeled vehicle, a traffic signal, a light, a road, a structure, a bump, a geographical feature, and an animal.

The navigation information may include at least one selected from among map information, information on a set destination, information on a route to the set destination, and information on various object located along the route, lane information, or information on the current location of the vehicle 10.

The navigation information may be generated by a navigation apparatus provided in the vehicle 10.

The vehicle state information may include vehicle position information, vehicle speed information, vehicle tilt information, vehicle weight information, vehicle direction information, vehicle battery information, vehicle fuel information, vehicle tire pressure information, vehicle steering information, in-vehicle temperature information, in-vehicle humidity information, pedal position information, vehicle engine temperature information, etc.

The vehicle state information may be generated based on sensing information of various sensors provided in the vehicle 10.

The memory 140 may store basic data for each unit of the lamp 100, control data for the operational control of each unit of the lamp 100, and input/output data of the lamp 100.

The memory 140 may be any of various hardware storage devices, such as a ROM, a RAM, an EPROM, a flash drive, and a hard drive.

The memory 140 may store various data for the overall operation of the lamp 100, such as programs for the processing or control of the processor 170.

The memory 140 may be a subordinate element of the processor 170.

Under the control of the processor 170, the light generation unit 160 may convert electrical energy into light energy.

The light generation unit 160 may include an array 200 on which a plurality of groups of micro Light Emitting Diode (LED) chips is disposed.

The array 200 may be formed flexible.

The plurality of groups of micro LED chips may have different shapes.

In some implementations, there may be provided a plurality of arrays. The plurality of arrays may form an array module 200*m* (see FIG. 6).

In some implementations, the array module 200*m* may be configured such that a plurality of arrays is stacked with one another.

The array module 200*m* may be formed flexible.

Figure 5:
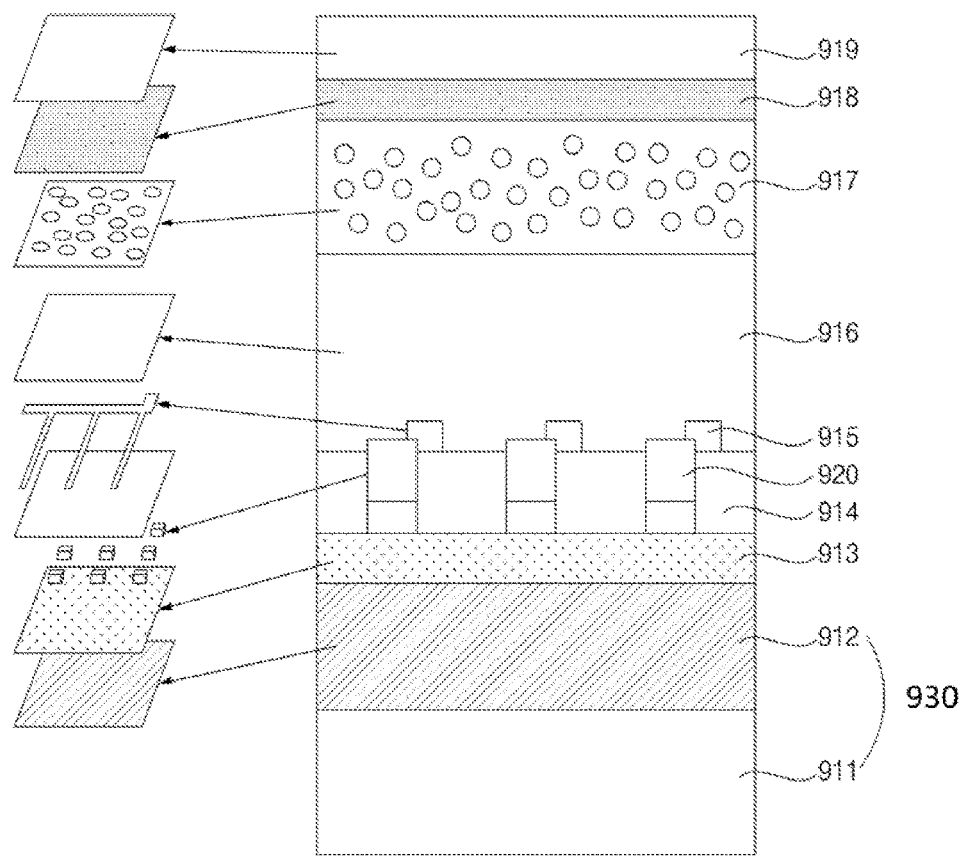
FIG. 5 is a diagram illustrating an example array module in which a micro LED chip is disposed.

For example, the array 200 may be flexible, and a Flexible Copper Clad Laminate (FCCL) may be disposed on a flexible base 911 (see FIG. 5). Light Emitting Diode (LED) chips of few micro meters (μm) may be transferred to and formed on the FCCL.

A micro LED chip may be referred to as a micro LED light emitting device package.

A micro LED chip may include a light emitting device therein.

A micro LED is an LED chip of a few micro-meter. For example, the size of a micro LED may be 5 to 15 μm.

A micro LED may be transferred to a substrate.

The array 200 may include a substrate and a subarray in which the plurality of micro LED chips is disposed. The array 200 may include one or more subarrays.

The subarray may be in any of various shapes.

For example, the subarray may be in a shape of a figure having a predetermined area.

For example, the subarray may have a circular shape, a polygonal shape, or a fan shape.

In some examples, the substrate includes a Flexible Copper Clad Laminated (FCCL) substrate.

For example, a base 911 (FIG. 5) and a first electrode 912 (see FIG. 5) may form a substrate.

In some examples, a base 911 (see FIG. 8) and a second anode 912*b* (see FIG. 8) may form a substrate.

The position adjustment unit 165 may adjust a position of the light generation unit.

The position adjustment unit 165 may control the light generation unit 160 to be tilted. Due to the tilting control of the light generation unit 160, output light may be adjusted in an up-down direction (e.g., the overall height direction).

The position adjustment unit 165 may control the light generation unit 160 to be panned. Due to the panning control of the light generation unit 160, output light may be adjusted in a left-right direction (e.g., the overall width direction).

The position adjustment unit 165 may further include a driving force generation unit (e.g., a motor, an actuator, and a solenoid) that provides a driving force required to adjust a position of the light generation unit 160.

When the light generation unit 160 generates a low beam, the position adjustment unit 165 may adjust a position of the light generation unit 160 downward further than when the light generation unit 160 generates a high beam.

When the light generation unit 160 generates a high beam, the position adjustment unit 165 may adjust a position of the light generation unit 160 upward further than when the light generation unit 160 generates a low beam.

The processor 170 may be electrically connected to each unit of the lamp 100. The processor 170 may control overall operation of each unit of the lamp 100.

The processor 170 may control the light generation unit 160.

By adjusting an amount of electrical energy supplied to the light generation unit 160, the processor 170 may control the light generation unit 160.

The processor 170 may control the array 200 on a region basis.

For example, the processor 170 may control the array 200 on a region basis in a manner of supplying a different amount of electrical energy to micro LED chips disposed on each region of the array 200.

The processor 170 may control the array module 200*m* on a layer basis.

The plurality of layers in the array module 200*m* may be composed of a plurality of arrays 200.

For example, the processor 170 may control the array module 220*m* on a layer basis in a manner of supplying a different amount of electrical energy to micro LED chips arranged in each layer of the plurality of arrays 200.

Under the control of the processor 170, the power supply unit 190 may supply electrical energy to each unit of the lamp 100. For example, the power supply unit 190 may be supplied with power from a battery inside the vehicle 10.

Figure 3A:
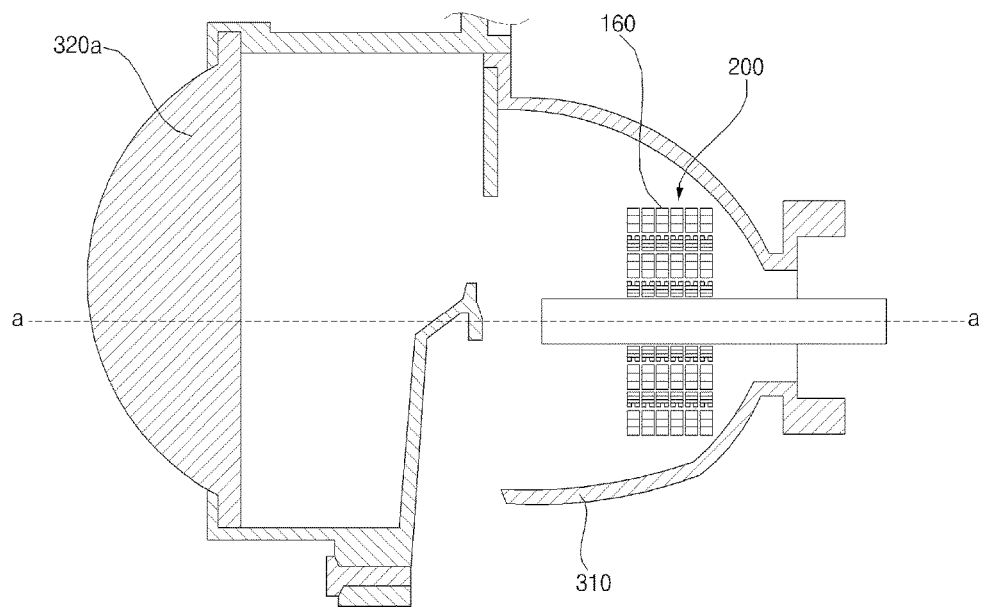
FIGS. 3A and 3B are diagrams illustrating an example lamp for a vehicle.

FIG. 3A is a diagram illustrating an example lamp for a vehicle.

FIG. 3A is a cross-sectional view of a head lamp an example of a lamp for a vehicle.

Referring to FIG. 3A, the lamp 100 may include a light generation unit 160, a reflector 310, and a lens 320*a*.

The reflector 310 may reflect light generated by the light generation unit 160. The reflector 310 may induce the light to be emitted forward or rearward of the vehicle 10.

The reflector 310 may be formed of an aluminum (Al) or silver (Ag) material having a good reflectance, or may be coated on a reflective surface.

The lens 320a may be disposed before the light generation unit 160 and the reflector 310. The lens 320a refracts light, generated by the light generation unit 160 and reflected by the reflector 310, and allows the refracted light to pass therethrough. The lens 320a may be an aspheric lens.

The lens 320a may change an optical path of the light generated by the light generation unit 160.

The lens 320a may be formed of transparent synthetic resin or glass.

Figure 3B:
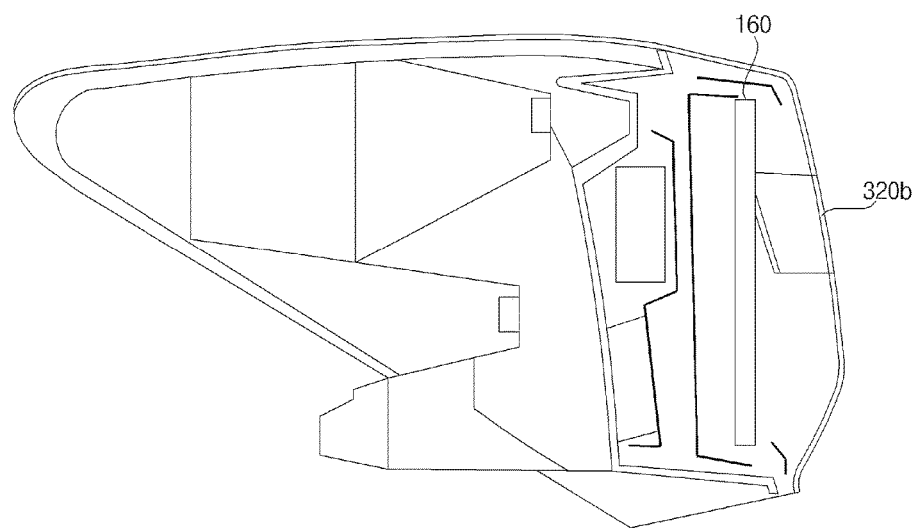

FIG. 3B is a diagram for explaining a lamp for a vehicle.

FIG. 3B illustrates an exemplary cross-section of a rear combination ramp 100b as an example of the lamp 100.

Referring to FIG. 3B, a lamp 100 for a vehicle may include a light generation unit 160, and a lens 320b.

The lens 320b may cover the light generation unit 160. The lens 320b may allow light, generated by the light generation unit 160, to be refracted and pass therethrough. The lens 320b may be an aspheric lens.

The lens 320b may change an optical path of the light generated by the light generation unit 160.

The lens 320b may be formed of transparent synthetic resin or glass, for example.

Figure 4:
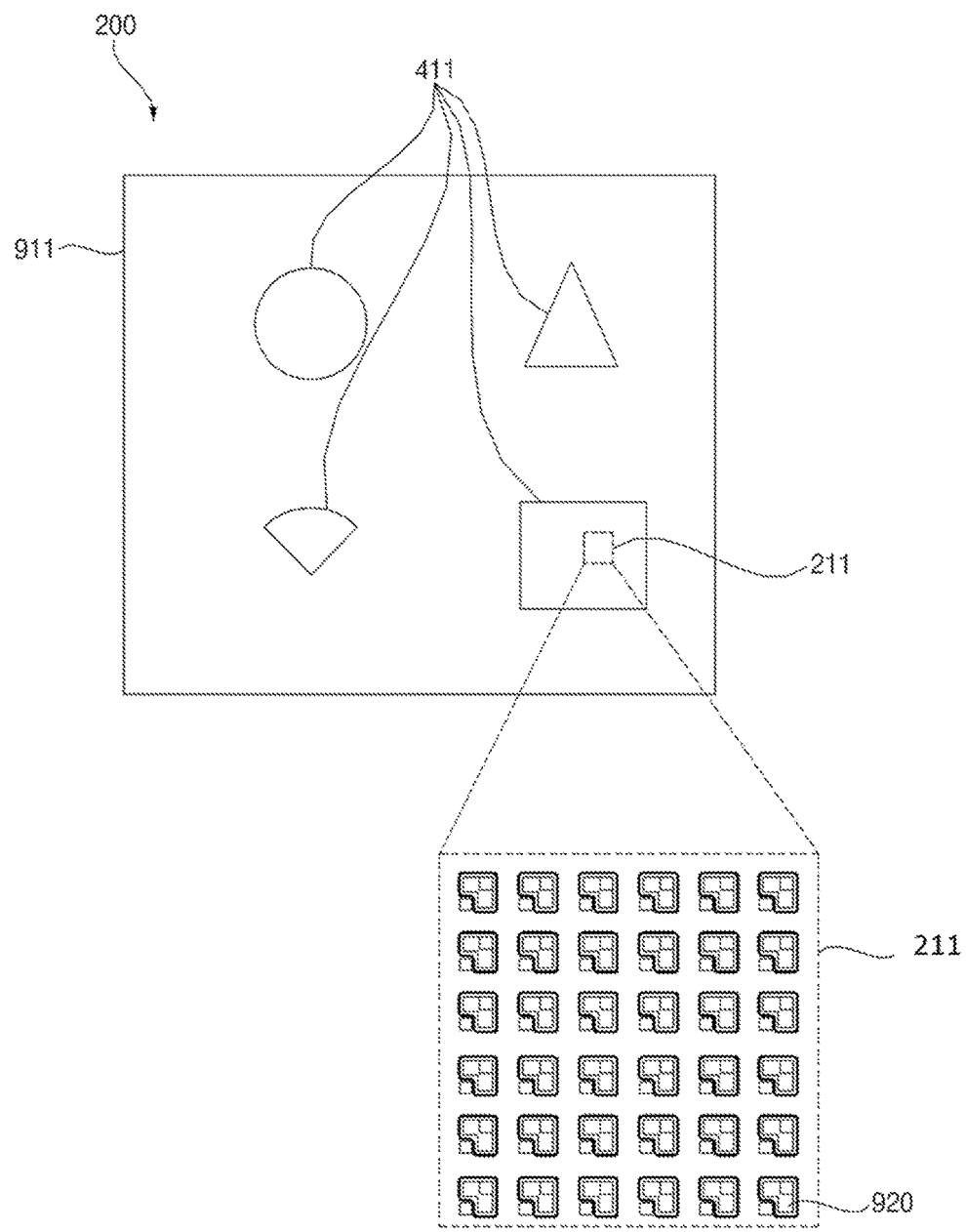
FIG. 4 is a diagram illustrating an example array module in which an example plurality of micro Light Emitting Diode (LED) chips are disposed.

FIG. 4 is a diagram illustrating an example plurality of array modules.

Referring to FIG. 4, a plurality of micro LED chips 920 may be disposed on the array 200.

The plurality of micro LED chips 920 may be transferred to the array 200.

An interval for micro LED chips 920 on the array 200, and a density of micro LED chips 920 (that is, the number of micro LED chips per unit area) on which the array 200 may be determined depending on a transfer interval.

The array 200 may include a plurality of sub-arrays 411 in which the plurality of groups of micro LED chips is disposed, respectively. The array 200 may include an area 211.

The array 200 may include a base 911 and one or more sub-arrays 411.

The base 911 may be formed of a polyimide (PI) material or the like.

In some implementations, the base 911 may be a substrate. For example, the base 911 may be a Flexible Copper Clad Laminate (FCCL) which will be described later.

The sub-arrays 411 may be disposed on the base 911.

A plurality of micro LED chips 920 may be disposed in the sub-arrays 411.

The sub-arrays 411 may be generated by cutting a main array which is an FCCL where the plurality of micro LED chips 920 is disposed.

In this case, a shape of each sub-array 411 may be determined by a shape into which the main array is cut.

For example, the sub-array 411 may have a shape of a two-dimensional figure (e.g., a circular, polygonal, or fan shape).

FIG. 5 is a diagram illustrating an example array where micro LED chips are disposed.

Referring to FIG. 5, the array 200 may include a polyimide layer 911, a Flexible Copper Clad Laminated (FCCL) 912, a reflective layer 913, an inter-layer dielectric film 914, a plurality of micro LED chips 920, a second electrode 915, an optical spacer 916, a phosphor layer 917, a color filter film 918, and a cover film 919.

The polyimide layer 911 may be formed flexible.

The FCCL 912 may be formed of copper. The FCCL 912 may be referred to as a first electrode 912 in this application.

In some implementations, a combination of a layer composed of the polyimide layer 911 and the FCCL 912 may be referred to as a base 930.

In some implementations, the polyimide layer 911 may be referred to as a base 911 in this application.

The first electrode 912 and the second electrode 915 may be electrically connected to the plurality of micro LED chips 920 so as to provide power thereto.

The first electrode 912 and the second electrode 915 may be light transmissive electrodes.

The first electrode 912 may be an anode.

The second electrode 915 may be a cathode.

The first electrode 912 and the second electrode 915 may include at least one metal material or a combination of metal materials, including but not limited to nickel (Ni), platinum (Pt), ruthenium (Ru), iridium (Ir), rhodium (Rh), tantalum (Ta), molybdenum (Mo), titan (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO), or Indium Zinc Oxide (IZO).

The first electrode 912 may be formed between the polyimide layer 911 and the reflective layer 913.

The second electrode 915 may be formed on the inter-layer dielectric film 914.

The reflective layer 913 may be formed on the FCCL 912. The reflective layer 913 may reflect light generated by the plurality of micro LED chips 920. The reflective layer 913 is made of silver Ag, for instance.

The inter-layer dielectric film 914 may be formed on the reflective layer 913.

The plurality of micro LED chips 920 may be formed on the FCCL 912. The plurality of micro LED chips 920 may be attached to the reflective layer 913 or the FCCL 912 using a solder material or an Anisotropic Conductive Film (ACF).

In some example, each micro LED chip 920 may be an LED chip having a size of 10-100 μm.

The optical spacer 916 may be formed on the inter-layer dielectric film 914. The optical spacer 916 is used to keep the plurality of micro LED chips 920 and the phosphor layer 917, and may be formed of an insulating material.

The phosphor layer 917 may be formed on the optical spacer 916. The phosphor layer 917 may be formed of resin in which phosphorus is evenly distributed. Depending on a wavelength of light emitted from a micro LED chips 920, any one selected from a blue light-emitting phosphor, a blue-green light-emitting phosphor, a green light-emitting phosphor, a yellow-green light-emitting phosphor, a yellow light-emitting phosphor, a yellow-red light-emitting phosphor, an orange light-emitting phosphor, and a red light-emitting phosphor may be applied as the phosphor.

That is, a phosphor may be excited by light of a first color, which is emitted from the micro LED chips 920, to thereby generate a second color.

The color filter film 918 may be formed on the phosphor layer 917. The color filter film 918 may realize a specific color for light which has passed the phosphor layer 917. The color filter film 918 may realize at least one or a combination of red (R), green (G), or blue (B).

The cover film 919 may be formed on the color filter film 918. The cover film 919 may protect the array 200.

Figure 6:
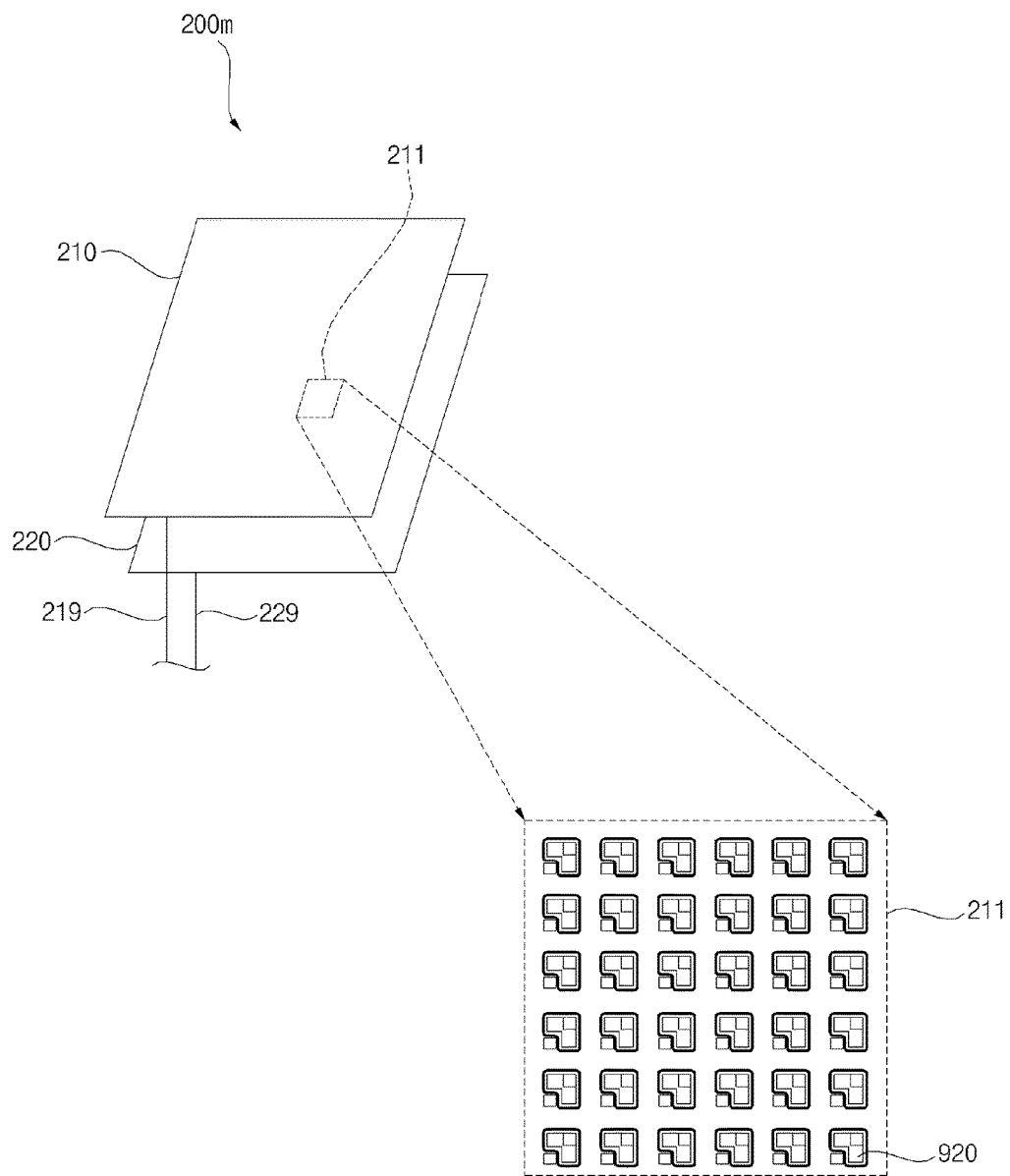
FIG. 6 is a diagram illustrating an example plurality of array modules.

FIG. 6 is a diagram illustrating an example array module.

Referring to FIG. 6, the light generation unit 160 may include an array module 200m which includes a plurality of arrays.

For example, the light generation unit 160 may include a first array 210 and a second array 220.

The first array 210 may be different from the second array 220 in terms of at least one of: an interval for a plurality of micro LED chips, positions of the plurality of micro LED chips, or a density of the plurality of micro LED chips.

The second array 220 may be different from the first array 210 in terms of at least one of: an interval for a plurality of micro LED chips, positions of the plurality of micro LED chips, or a density of the plurality of micro LED chips.

The density of the plurality of micro LED chips indicates the number of micro LED chips per unit area.

In the first array 210, a first group of micro LED chips may be disposed in a first pattern.

The first pattern may be determined by at least one of: an interval for micro LED chips included in the first group, positions of the micro LED chips included in the first group on an array module, or a density of the micro LED chips included in the first group.

A plurality of micro LED chips included in the first array 210 may be disposed at a first interval.

The plurality of micro LED chips included in the first group may be disposed at the first interval.

In the second array 220, a second group of micro LED chips may be disposed in a second pattern which is different from the first pattern.

The second pattern may be determined by at least one of: an interval for the micro LED chips included in the second group, positions of the micro LED chips included in the second group, or a density of the micro LED chips included in the second group.

The plurality of micro LED chips included in the second array 220 may be disposed at an interval as the same as the interval at which the plurality of micro LED chips included in the first array 210 is disposed.

The plurality of micro LED chips included in the second group may be disposed at an interval as the same as the interval at which the plurality of micro LED chips included in the first group is disposed.

That is, the plurality of micro LED chips included in the second group may be disposed at the first interval.

The plurality of micro LED chips included in the second group may be disposed not to overlap the plurality of micro LED chips included in the first group in a vertical or horizontal direction.

For example, the first group of micro LED chips may be disposed on the first array 210 not to overlap the second group of micro LED chips when viewed from above while the first array 210 and the second array 220 overlap each other.

For example, the second group of micro LED chips may be disposed on the second array 220 not to overlap the first group of micro LED chips when viewed from above while the second array 220 and the first array 210 overlap each other.

Due to such arrangement, it is possible to minimize intervention by the first group of micro LED chips in output power from the second group of micro LED chips.

In some implementations, the light generation unit 160 may include three or more arrays.

Figure 7A:
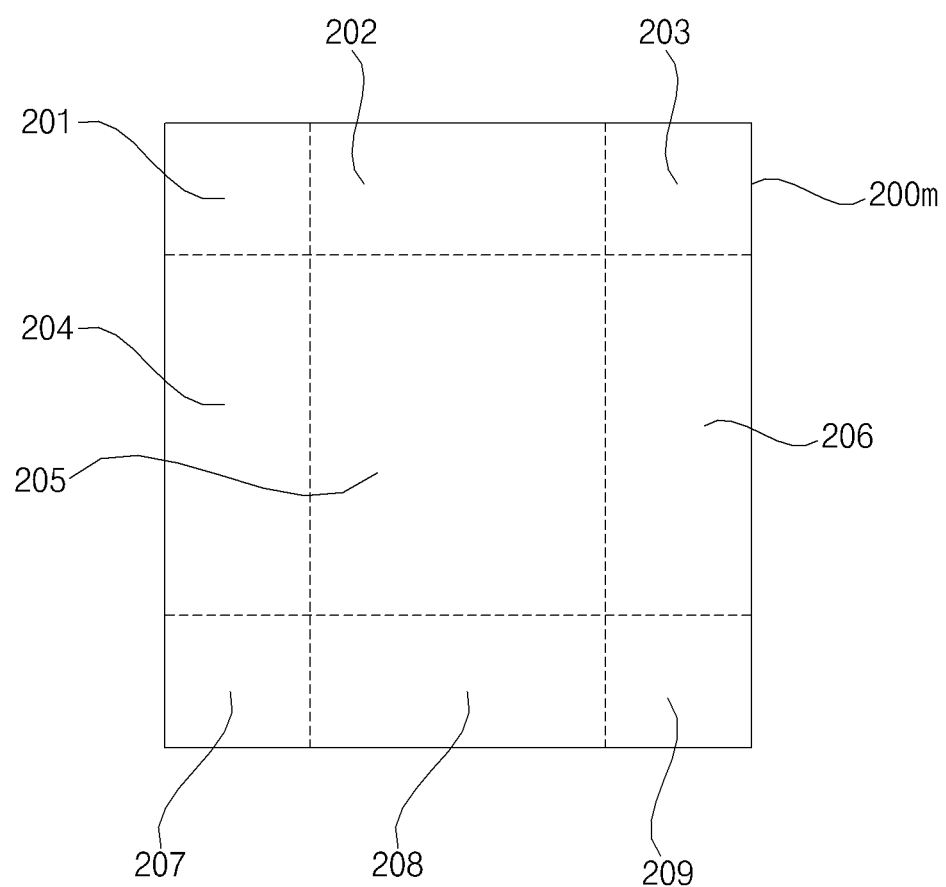
FIG. 7A illustrates an exemplary top view of an example plurality of array modules overlapping each other.

FIG. 7A illustrates an exemplary top view of an example plurality of array modules overlapping each other.

Figure 7B:
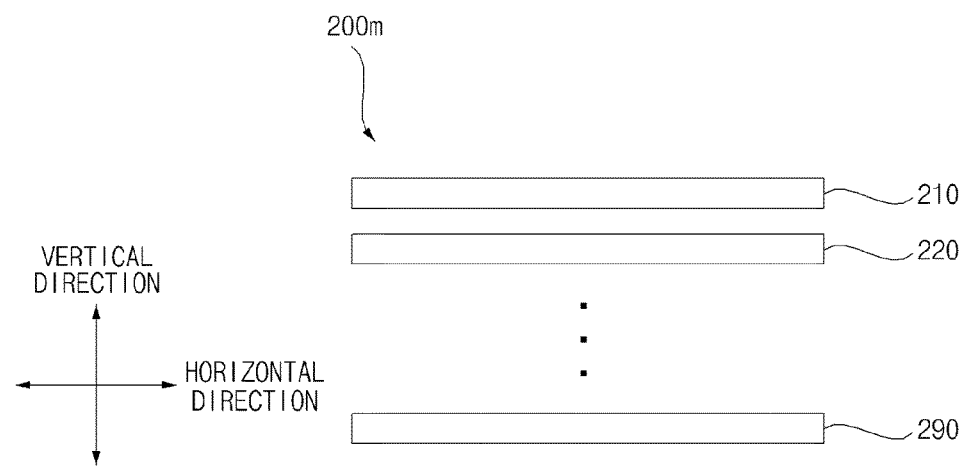
FIG. 7B illustrates an exemplary side view of the plurality of array modules overlapping each other.

FIG. 7B illustrates an exemplary side view of the plurality of array modules overlapping each other.

Referring to FIGS. 7A and 7B, the processor 170 may control an array module 200m on a region basis (e.g., any of region 201 to 209).

The processor 170 may adjust a light distribution pattern by controlling the array module 200m on a region basis.

The array module 200m may be divided into a plurality of regions 201 to 209.

The processor 270 may adjust an amount of electrical energy to be supplied to each of the plurality of regions 201 to 209.

The processor 170 may control the array module 200m on a layer basis.

The processor 270 may adjust an amount of light of output power by controlling the array module 200m on a layer basis.

The array module 200m may be composed of a plurality of layers. The plurality of layers may be composed of a plurality of arrays, respectively.

For example, a first layer of the array module 200m may be formed by a first array, and a second layer of the array module 200m may be formed by a second array.

The processor 270 may adjust an amount of electrical energy to be supplied to each of the plurality of layers.

Figure 8:
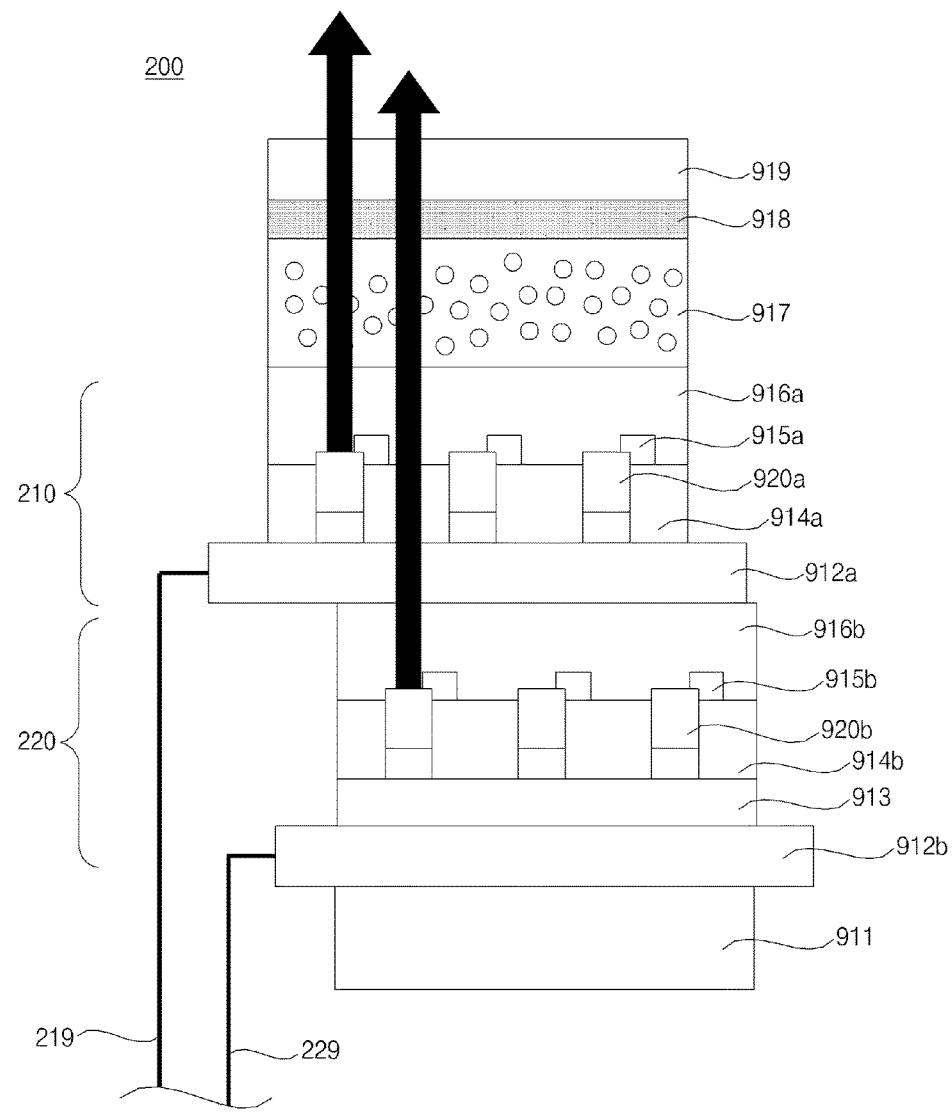
FIG. 8 is a diagram an example array module.

FIG. 8 is a diagram an array module.

FIG. 8 illustrates a first array 210 and a second array 220 included in the array module 200m. However, the array module 200m may include three or more arrays.

Referring to FIG. 8, the array module 200m may include a polyimide layer 911, the first array 210, and the second array 220.

In some implementations, the array module 200m may further include a phosphor layer 917, a color filter film 918, and a cover film 919 in combination or individually.

The polyimide layer 911 may be formed flexible.

The second array 220 may be disposed on the base 911.

In some implementations, a combination of a layer composed of the polyimide layer 911 and the second anode 912b may be referred to as a base 930.

In some implementations, the polyimide layer 911 may be referred to as a base.

The second array 220 may be disposed between the first array 210 and the base 911.

The second array 220 may include the second anode 912b, a reflective layer 913, a second inter-layer dielectric film 914b, a second group of micro LED chips 920b, a second optical spacer 916b, and a second cathode 915b.

In some examples, the second anode 912b may be an FCCL. The second anode 912b may be formed of copper.

The second anode 9112 and the second cathode 915b may be light transmissive electrodes.

The second anode 912b and the second cathode 915b may be referred to as transparent electrodes.

The second array 220 may include a transparent electrode.

The second anode 912b and the second cathode 915b may include at least one metal material or a combination of metal materials, including but not limited to nickel (Ni), platinum (Pt), ruthenium (Ru), iridium (Ir), rhodium (Rh), tantalum (Ta), molybdenum (Mo), titan (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO), or Indium Zinc Oxide (IZO).

The second anode 912b may be formed between the base 911 and the reflective layer 913.

The second cathode 915b may be formed on the second inter-layer dielectric film 914b.

The reflective layer 913 may be formed on the second anode 912b. The reflective layer 913 may reflect light generated by a plurality of micro LED chips 920. The reflective layer 913 may be made of silver (Ag), for instance.

The second inter-layer dielectric film 914b may be formed on the reflective layer 913.

The second group of micro LED chips 920b may be formed on the second anode 912b. Each of the micro LED chips 920b included in the second group may be attached to the reflective layer 913 or the second anode 912b using a solder material or an Anisotropic Conductive Film (ACF).

The second optical spacer 916b may be formed on the second inter-layer dielectric film 914b. The second optical spacer 916b is used to keep the micro LED chips 920b and the first array 210 at a distance from each other, and the second optical spacer 916b may be formed of an insulating material.

The first array 210 may be formed on the second array 220.

The first array 210 may include a first anode 912a, a first inter-layer dielectric film 914a, a first group of micro LED chips 920a, a first optical spacer 916a, and a first cathode 915a.

The first anode 912a may be an FCCL. The first anode 912a may be formed of copper.

The first anode 912a and the first cathode 915a may be light-transmissive electrodes.

The first anode 912a and the first cathode 915a may be referred to as transparent electrodes.

The first array 210 may include a transparent electrode.

The first anode 912a and the first cathode 915a may include at least one metal material or a combination of metal materials, including but not limited to nickel (Ni), platinum (Pt), ruthenium (Ru), iridium (Ir), rhodium (Rh), tantalum (Ta), molybdenum (Mo), titan (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO), or Indium Zinc Oxide (IZO).

The first anode 912a may be formed between the second optical spacer 916b and the first inter-layer dielectric film 914a.

The first cathode 915a may be formed on the first inter-layer dielectric film 914a.

The first inter-layer dielectric film 914a may be formed on the first anode 912a.

The first group of micro LED chips 920a may be formed on the first anode 912a. Each of the micro LED chips 920a included in the first group may be attached to the first anode 912a using a solder material or an Anisotropic Conductive Film (ACF).

The first optical spacer 916a may be formed on the first inter-layer dielectric film 914a. The first optical spacer 916a is used to keep the micro LED chips 920a and the phosphor layer 917 at a distance from each other, and the first optical spacer 916a may be formed of an insulating material.

The phosphor layer 910 may be formed on the first array 210 and the second array 220.

The phosphor layer 917 may be formed on the first optical spacer 916a. The phosphor layer 917 may be formed of resin in which a phosphorus is evenly distributed. Depending on a wavelength of light emitted from the micro LED chips 920a and 920b included in the first and second groups, any one selected from a blue light-emitting phosphor, a blue-green light-emitting phosphor, a green light-emitting phosphor, a yellow-green light-emitting phosphor, a yellow light-emitting phosphor, a yellow-red light-emitting phosphor, an orange light-emitting phosphor, and a red light-emitting phosphor may be applied as the phosphor.

The phosphor layer 917 may change wavelengths of lights emitted from the micro LED chips 920a and 920b included in the first and second groups.

The phosphor layer 917 may change a wavelength of first light generated by the micro LED chips 920a included in the first group, and a wavelength of second light generated by the micro LED chips 920b included in the second group.

The color filter film 918 may be formed on the phosphor layer 917. The color filter film 918 may realize a specific color for light which has passed through the phosphor layer 917. The color filter film 918 may realize any one of red (R), green (G), blue (B), or a combination thereof.

The cover film 919 may be formed on the color filter film 918. The cover film 919 may protect the array module 200m.

The plurality of micro LED chips 920b included in the second array 220 may be disposed not to overlap the plurality of micro LED chips 920a included in the first array 210 in a vertical or horizontal direction.

The plurality of micro LED chips 920b included in the second group may be disposed not to overlap the plurality of micro LED chips 920a included in the first group in a vertical or horizontal direction.

The vertical direction may be a direction in which the array module 200m is stacked.

The micro LED chips 920a and 920b included in the first and second groups may output light in the vertical direction.

The horizontal direction may be a direction in which the micro LED chips 920a and 920b included in the first and second groups are disposed.

The horizontal direction may be a direction in which the base 911, the first and second anodes 912a and 912b, or the phosphor layer 917 extends.

In some examples, the lamp 100 may further include a wire via which power is supplied to the array module 200m.

For example, the lamp 100 may include a first wire 219 and a second wire 229.

Via the first wire 219, power may be supplied to the first array 210. The first wire 219 may consist of a pair of wires. The first wire 219 may be connected to the first anode 912a and/or the first cathode 915a.

Via the second wire 229, power may be supplied to the second array 220. The second wire 229 may consist of a pair of wires. The second wire 229 may be connected to the second anode 912b and/or the second cathode 915b.

The first wire 219 and the second wire 229 may be disposed not to overlap each other.

Figure 9:
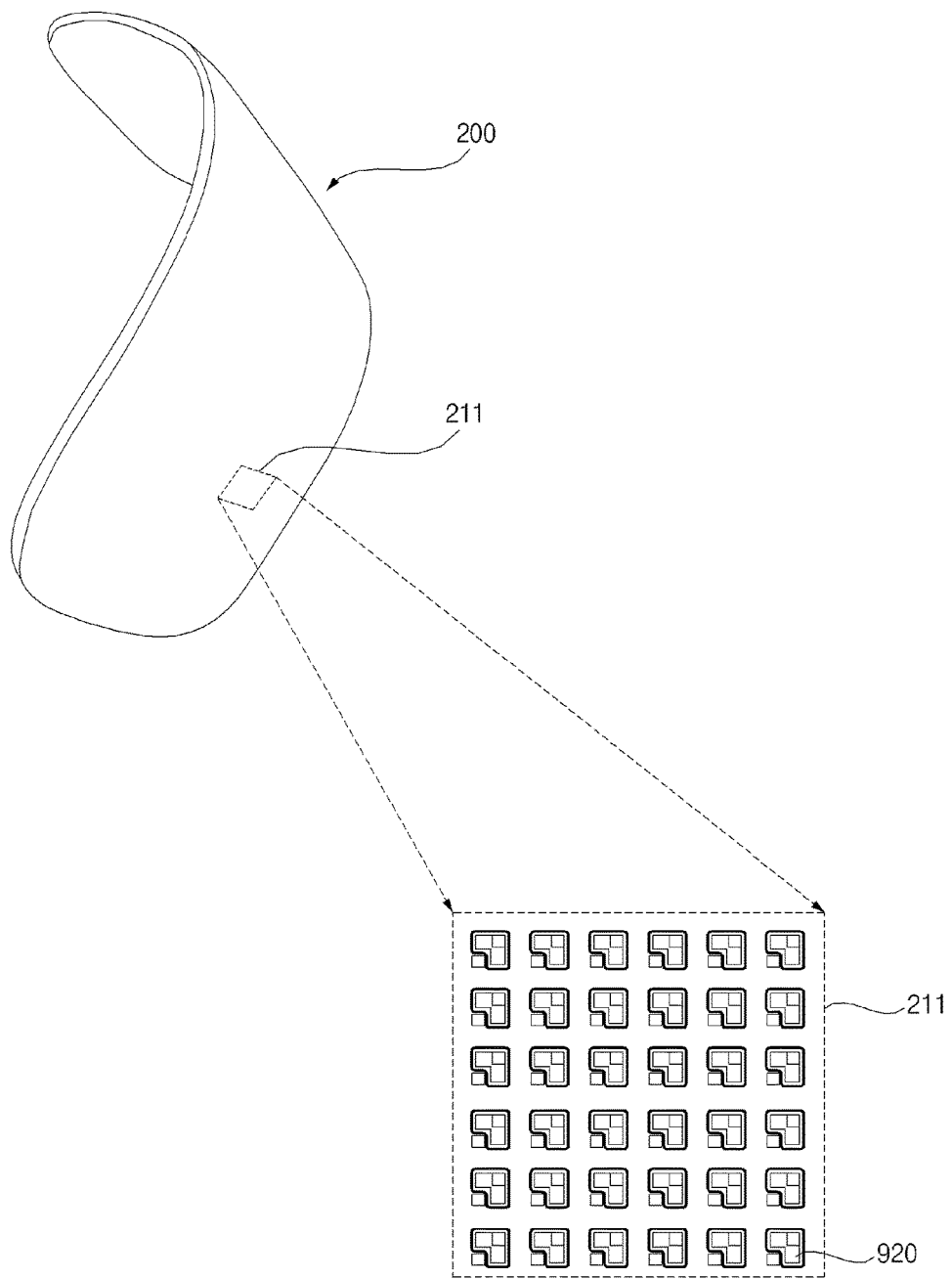
FIG. 9 is a diagram illustrating an example exterior appearance of an example array.

FIG. 9 is a diagram illustrating an example exterior of an array.

Figure 10B:
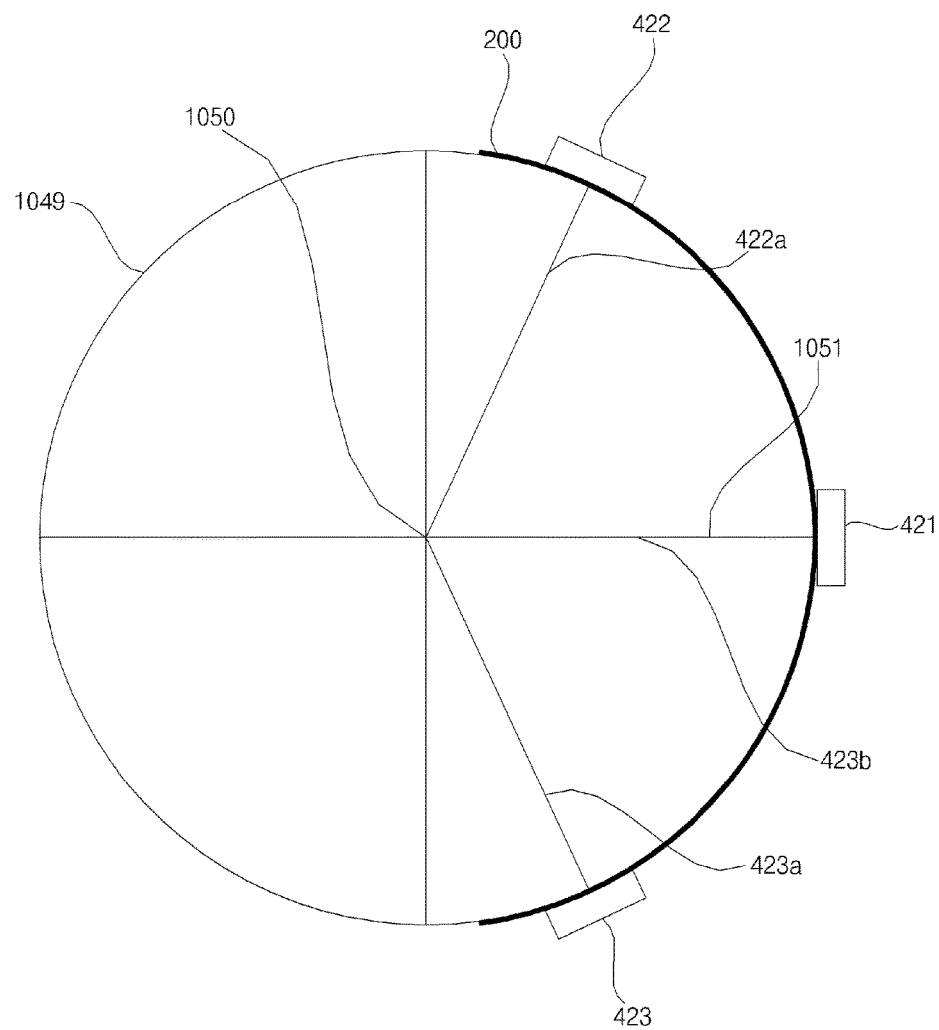

FIGS. 10A and 10B are schematic views of an example array and example micro LED chips. FIG. 10 is an exemplary side view.

Referring to the drawings, a plurality of groups of micro LED chips 920c and 920d may be disposed in the array 200.

The micro LED chips 920c and 920d included in the plurality of groups may have different shapes.

As illustrated in FIG. 10A, the array 200 may be bent with a different curvature in each region.

The array 200 may be divided into a plurality of regions 421, 422, and 423.

The array 200 may be divided into the plurality of regions 421, 422, and 423 according to bending curvatures thereof.

The array 200 may include a first region 421, a second region 422, and a third region 423.

The first region 421 may be a region which is bendable with a first curvature.

The second region 422 may be a region which is bendable with a second curvature. The second curvature may be greater than the first curvature.

The third region 423 may be a region which is bendable with a third curvature. The third curvature may be greater than the first curvature.

In some examples, a curvature may be defined as the inverse of the radius of the circle which contacts an inner surface (a surface in the opposite to a light output direction) of the array 200 which is bent.

In addition, a curvature may indicate a degree of bending of the array 200.

For example, when a curvature for one region of the array 200 is 0, the region may be in a flat state where the region is flat.

Micro LED chips 920c, 920d, and 920d respectively disposed in the plurality of regions 421, 422, and 423 may have different shapes.

A micro LED chip 920c included in a first group and having a first shape may be disposed in the first region 421. The micro LED chip 920c included in the first group and having the first shape will be described with reference to FIG. 11A.

A micro LED chip 920d included in a second group and having a second shape may be disposed in the second region 422. The micro LED chip 920d included in the second group and having the second shape will be described with reference to FIG. 11B.

A micro LED chip 902d included in a third group and having the second shape and may be disposed in the third region 423. The micro LED chip 902d included in the third group and having the second shape will be described with reference to FIG. 11B. The micro LED chip included in the third group may be horizontally symmetric to the micro LED chip included in the second group.

As illustrated in FIG. 10B, the array 200 may be bent with a constant curvature.

When viewed from the side, the array 200 may be bent to contact a virtual circle 1049 in the overall height direction. In this case, the array 200 may have an arc-shaped cross-section. In this case, the curvature of the array 200 may be the inverse of the radius of the virtual circle 1049.

The array 200 may be divided into a plurality of regions 421, 422, and 423.

The array 200 may be divided into a plurality of regions 421, 422, and 423 according to where they are positioned on the array 200.

The array 200 may be divided based on angle ranges in a clockwise direction or in a counter clockwise direction between a virtual line, which connects a center 1050 of a virtual circle 1049 and the array 200, and a line 1052, which passes through the center 1050 of the virtual circle 1049 and is parallel to the horizon.

In this case, the counter clockwise direction to the line 1051 passing through the virtual line 1048 and being parallel to the horizon is defined as "+", and the clockwise direction is defined as "−".

The array 200 may include a first region 421, a second region 422, and a third region 423.

The first region 421 may be a region with a first angle range. The first angle range may be a range between +70° and −70°.

The second region 422 may be a region with a second angle range. The second angle range may a range between +70° to +90°.

The third region 423 may be a region with a third angle range. The third angle range may be a range between −70° and −90°.

The plurality of micro LED chips 920c, 920d, and 9220e respectively disposed in the plurality of regions 421, 422, and 423 may have different shapes.

A micro LED chip 920c included in a first group and having a first shape may be arranged in the first region 421. The micro LED chip 920c included in the first group and having the first shape will be described with reference to FIG. 11A.

A micro LED chip 920d included in a second group and having a second shape may be disposed in the second region 422. The micro LED chip 920d included in the second group and having the second shape will be described with reference to FIG. 11B.

A micro LED chip 920d included in a third group and having the second shape may be disposed in the third region 423. The micro LED chip 920d included in the third group and having the second shape will be described with reference to FIG. 11C. The micro LED chip included in the third group may be horizontally symmetric to the micro LED chip included in the second group.

In some implementations, the micro LED chips 920c, 920d, and 920e may output light in different directions.

For example, when the plurality of micro LED chips 920c, 920d, and 920e is placed in the same plane, the plurality of micro LED chips 920c, 920d, and 920e may output light in different directions, respectively.

FIGS. 11A to 11C are diagrams illustrating example shapes of an example plurality of micro LED chips.

FIG. 11A is a schematic view illustrating an example of a micro LED chip 920c included in a first group and having a first shape, the micro LED chip 920c which is shown in FIGS. 10A and 10B.

Referring to FIG. 11A, the micro LED chip 920c included in the first group and having the first shape (hereinafter, referred to as a first micro LED chip) may have a normal shape.

The first micro LED chip 920c may include a body 1100.

The body 1100 may include a p-n diode layer. The p-n diode layer may include a first-type semiconductor layer (e.g., a p-doped layer), an active layer, and a second-type semiconductor layer (e.g., a n-doped layer).

When viewed from the side, the first micro LED chip 920c may have a trapezoidal shape having an upper edge longer than a lower edge. A vertical cross-section of the body 1100 may be vertically symmetric.

When viewed from above, the body 1100 of the first micro LED chip 920c may have a rectangular shape.

The first micro LED chip 920c may output light 1101 in an upward direction and in a lateral direction. The first micro LED chip 920c may output the light in the upward direction and in any direction.

FIG. 11B is a schematic view illustrating an example of a micro LED chip 920d included in a second group and having a second shape, the micro LED chip 920d which is shown in FIGS. 10A and 10B.

Referring to FIG. 11B, the micro LED chip 920d included in the second group and having the second shape (hereinafter, referred to as a second micro LED chip) may have a shape different from the shape of the first micro LED chip 920c.

The second micro LED chip 920d may include a body 1111 and a reflective layer 1112.

The body 1111 may include a p-n diode layer. The p-n diode layer may include a first-type semiconductor layer (e.g., a p-doped layer), an active layer, and a second-type conductor layer (e.g., a n-doped layer).

The body 1111 may have a horizontal cross-section which gradually becomes greater toward the reflective layer 1112.

A vertical cross-section of the body 1111 may be vertically asymmetric.

For example, a side surface 1122 of the body 1111 may form a tilting angle relative to a direction vertical to a reflective layer 1112. The side surface 1122 of the body 1111 may form an acute angle relative to the reflective layer 1112.

In some examples, the tilting angle formed by the side surface 1122 of the body 1111 in the direction 1121 vertical to the reflective layer 1112 may be determined based on a second curvature.

For example, the greater the second curvature, the greater the tilting angle.

For example, the smaller the second curvature, the smaller the tilting angle.

The reflective layer 1112 may be disposed on the body 1111.

The reflective layer 1112 may reflect light generated by the body 1111. For example, the reflective layer 1112 may be made of silver (Ag).

When viewed from above, the body 1100 of the second micro LED chip 920d may have a rectangular shape.

The second micro LED chip 920d may focus and output light 1102 in one direction.

For example, when the lamp 100 functions as a rear combination lamp 100b, the second micro LED chip 920d may focus and output light 1102 in a direction rearward of the vehicle 10.

FIG. 11C is a schematic diagram illustrating another example shape of the micro LED chip 920d included in the second group and having the second shape according to FIGS. 10A and 10B.

The second micro LED chip 920d in FIG. 11C may have a shape different from the shape of the second micro LED chip shown in FIG. 11B.

The second micro LED chip 920d may include the body 111 and the reflective layer 1112.

The body 1111 may have a horizontal cross-section which becomes smaller toward the reflective layer 1112.

A vertical cross-section of the body 1111 may be vertically asymmetric.

The side surface 1122 of the body 1111 may be tilted relative to a direction 1121 vertical to the reflective layer 1112. The side surface 1122 of the body 1111 may form an obtuse angle relative to the reflective layer 1112.

FIGS. 12A and 12B are diagrams illustrating a plurality of groups micro LED chips disposed in an array.

As described above with reference to FIG. 10B, the array 200 may be bent with a constant curvature.

The array 200 may include a plurality of regions 421, 422, and 426.

The plurality of regions 421 and 422 may be distinguished from each another based on where each of the plurality of regions 421 and 422 is positioned on the array 200.

For example, when viewed from the side, the first region 421 may be a region ranging from +70° and −70° between a virtual line, which connects the center 1050 of the virtual circle and the array 200, and a line 1051, which passes through the center 1050 of the virtual circle and is parallel to the horizon.

For example, when viewed from side, the second region 422 may be a region ranging from −70° to −90° between the virtual line, which connects the center 1050 of the virtual circle and the array 200, and the line 1051, which passes through the center 1050 of the virtual circle and is parallel to the horizon.

As illustrated in FIG. 12A, the first micro LED chip 920c may be disposed in each of the first region 421 and the second region 422.

As illustrated in FIG. 12B, the first micro LED chip 920c may be disposed in the first region 421, and the second micro LED chip 920d may be disposed in the second region 422.

If the lamp 100 is functioning as the rear combination lamp 100b, high light intensity is required in the rear side of the vehicle 10.

When the lamp 100 includes an array 200 shown in FIG. 12A, a first micro LED chip 920c is disposed in a second region 422 to thereby allow light distributed upward and downward from the vehicle 10, thereby reducing light intensity of light rearward of the vehicle 10.

When the lamp 100 includes an array 200 shown in FIG. 12B, a second micro LED chip 920d is disposed in a second region 422 to thereby focus light in a direction rearward of the vehicle 10. In addition, uniformity of luminous intensity may improve and color deviation may decrease.

If the lamp 100 functions as the head lamp 100a or the fog lamp 10c, high light intensity forward of the vehicle 10 is required.

When the lamp 100 includes the array 200 shown in FIG. 12A, the first micro LED chip 920c is disposed in the second region 422 to thereby make light distributed upward or downward from the vehicle 10, thereby reducing light intensity of light forward of the vehicle 10.

When the lamp 100 includes the array 200 shown in FIG. 12B, the second micro LED chip 920d is disposed in the second region 422 to thereby make light focused in a direction forward of the vehicle 10. In addition, uniformity of luminous intensity may increase and color deviation may decrease.

Figure 13:
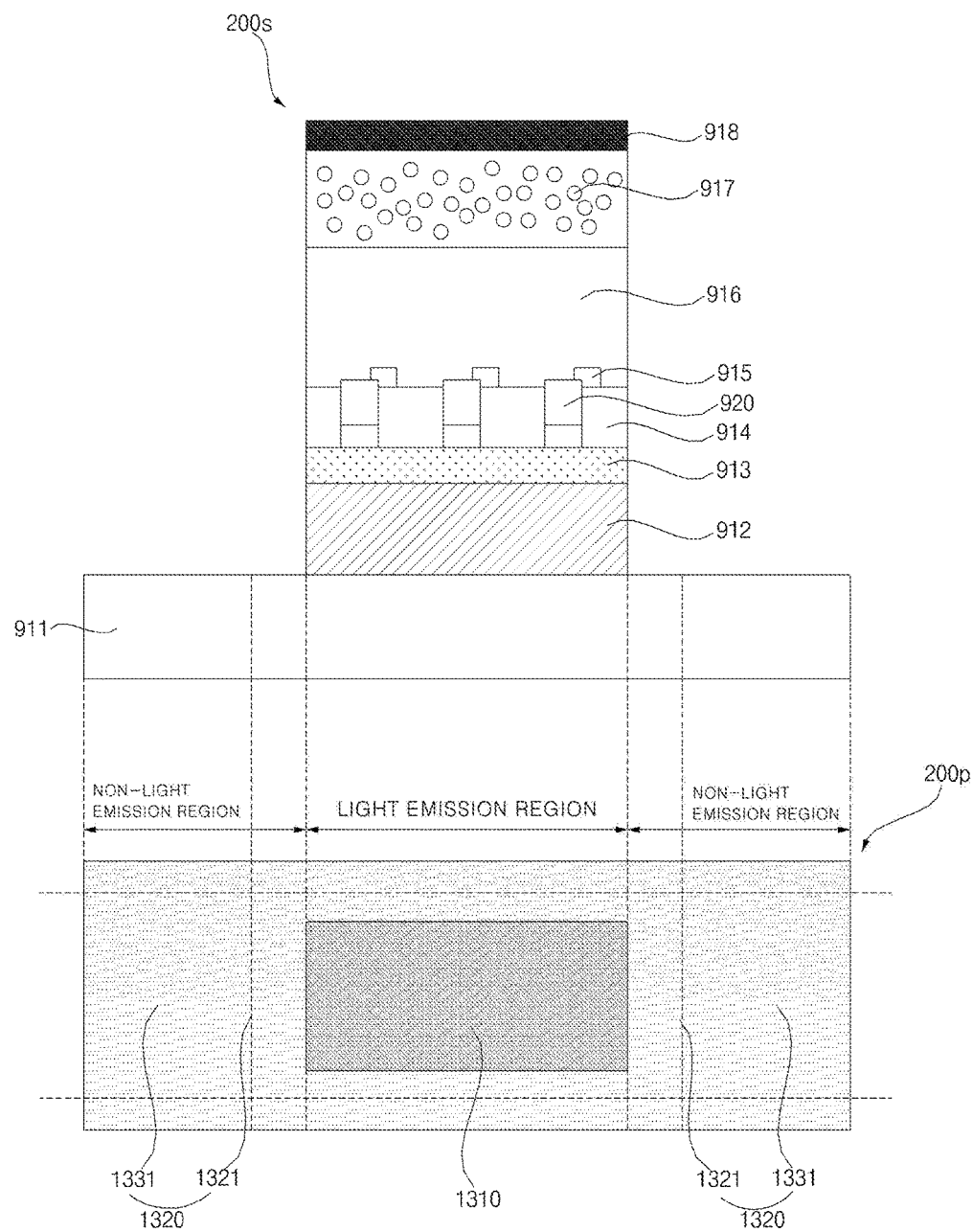
FIG. 13 is a diagram illustrating an example array.

FIG. 13 is a diagram illustrating an example array.

FIG. 13 shows an exemplary cross-sectional view 200a and an exemplary plane view 200p of an array.

The array 200 may include a polyimide layer 911, a first electrode 912, a reflective layer 913, an inter-layer dielectric film 914, a plurality of micro LED chips 920, a second electrode 915, an optical spacer 916, a phosphor layer 917, and a color filter film 918.

In some implementations, the array 200 may further include a cover film 919.

Descriptions about components of the array 200 with reference to FIG. 5 may be applied to the first electrode 912, the reflective layer 913, the inter-layer dielectric film 914, the plurality of micro LED chips 920, the second electrode 915, the optical spacer 916, the phosphor layer 917, the color filter film 918, and the cover film 919 in FIG. 13.

As shown in the example of the reference numeral 200s, the polyimide layer 911 may extend in a horizontal direction further than at least one of the first electrode 912, the reflective layer 913, the inter-layer dielectric film 914, the optical spacer 916, the phosphor layer 917, the color filter film 918, or the cover film 919.

As the polyimide layer 911 extends in the horizontal direction further than another layer (or film), the array 200 may be divided into a first region 1310 and a second region 1320.

The first region 1310 may be a region where the plurality of micro LED chips 920 is disposed.

The first region 1310 may be referred to as a light emission region.

The polyimide layer 911, the first electrode 912, the reflective layer 913, the inter-layer dielectric film 914, the plurality of micro LED chips 920, the second electrode 915, the optical spacer 916, the phosphor layer 917, the color filter film 918, and the cover film 919 may be disposed on the first region 1310.

The second region 1320 may be defined as a region where the plurality of micro LED chips 920 is not disposed. The second region 1320 may be referred to as a non-light emission region.

The polyimide layer 911 may be disposed on the second region 1320.

At least a portion of the second region may be bent.

The second region may include a first bent portion 1321 and a fixing portion 1331.

The first bent portion 1321 may be a portion of the array 200 which is bent toward a bracket 1410.

The fixing portion 1331 may be a portion of the array 200 which embraces at least a portion of the bracket 1410 to keep the array 200 in close contact with the bracket 1410 and fixed to the bracket 1410.

Figure 14:
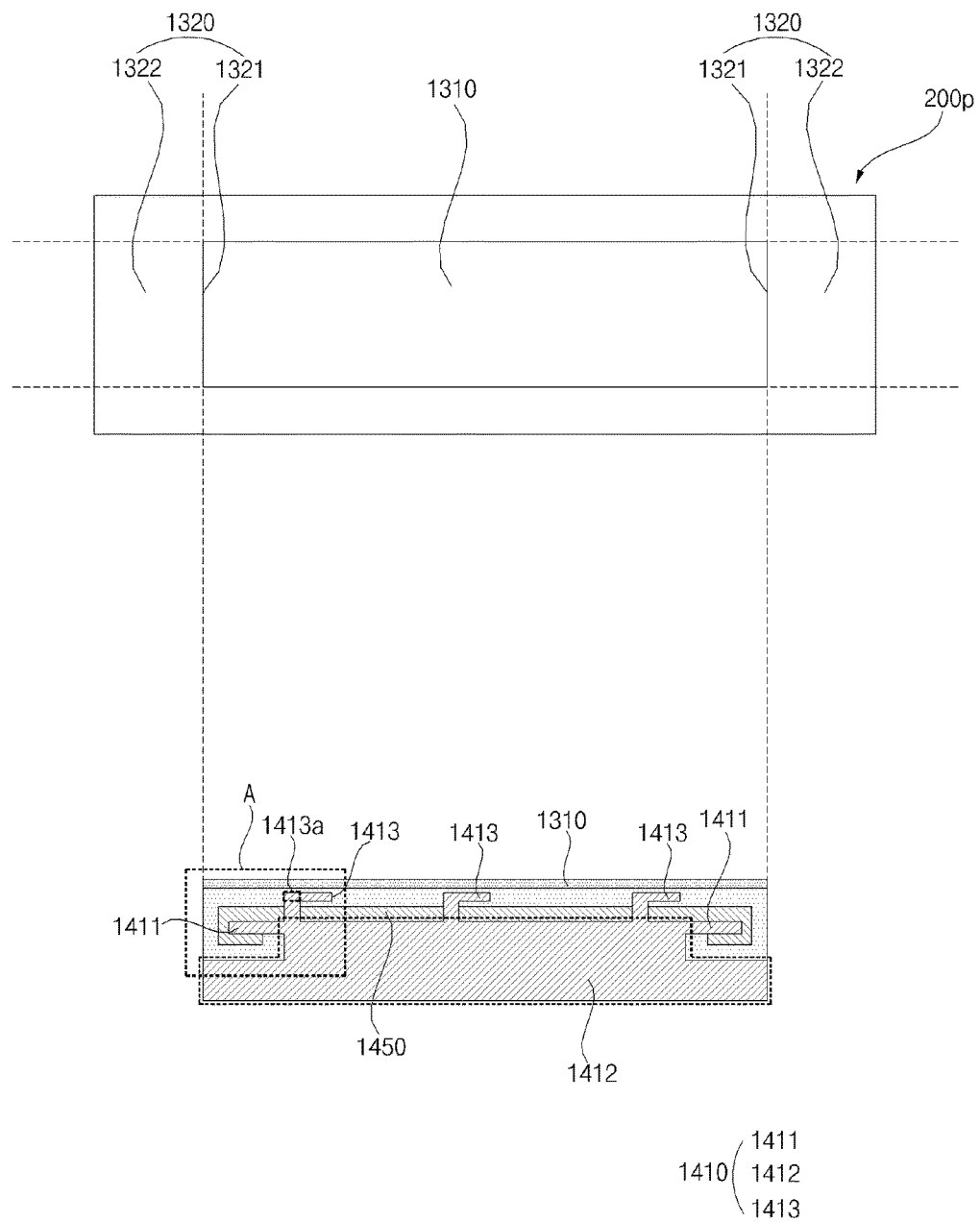
FIG. 14 is a diagram illustrating an example lamp for a vehicle.

FIG. 14 is a diagram illustrating an example lamp for a vehicle.

Referring to FIG. 14, the lamp 100 may further include a bracket 1410.

The array 200 may be bent to embrace at least a portion of the bracket 1410.

For example, the fixing portion 1331 of the array may be bent to embrace a protrusion 1411 of the bracket 1410.

The bracket 1410 may fix the array 200.

The bracket 1410 may include a base 1412, the protrusion 1411, and a holder 1413.

The base 1412, the protrusion 1411, and the holder 1413 may be integrally formed.

The base 1412 may support the protrusion 1411 and the holder 1413.

The base 1412 may have a shape corresponding to a shape of the array 200.

For example, when the array 200 is bent with a predetermined first curvature, a surface of the base 1412 facing the array 200 may be a surface curved to the first curvature.

The protrusion 1411 may protrude from the base 1412 in a direction in which the array 200 extends.

The holder 1413 may fix the array 200.

The holder 1413 may extend from the base 1412 in a first direction.

The holder 1413 may extend from the base 1412 toward the array 200.

For example, the holder 1413 may extend toward the first region 1310 of the array 200.

For example, the holder 1413 may extend toward the micro LED chip 920.

For example, the holder 1413 may extend in a direction vertical to the base 1412.

The holder 1413 may penetrate the array 200.

For example, the holder 1413 may penetrate a region of the array 200 on which the plurality of micro LED chips 920 is not disposed.

The holder 1413 extends from the base 1412 to penetrate the array 200, thereby fixing the array 200.

The holder 1413 may include at least one bent portion 1413a.

The bent portion 1413a may be formed as the holder 1413 extending in the first direction extends in a second direction.

The second direction may be a direction vertical to the first direction.

Even when an external force is applied during travelling of a vehicle, the bent portion 1413a may keep the array 200 and the bracket 1410 coupled to each other.

The array 200 may include a bent region which is a region bent with a predetermined curvature.

The holder 1413 may be positioned in a region corresponding to the bent region of the array 200.

For example, the holder 1413 may extend from the base 1412 toward a region corresponding to a bent region of the array 200. The holder 1413 may penetrate the bent region of the array 200.

The lamp 100 may further include an adhesive member 1450.

The adhesive member 1450 may allow the array 200 to be attached to the bracket 1410.

The adhesive member 1450 may be positioned between the array 200 and the bracket 1410.

The adhesive member 1450 may include an adhesive, a double sided tape, or an adhesive film.

At least part of the bracket 1410 may contact the array 200.

Even in the case where the adhesive member 1450 is disposed between the array 200 and the bracket 1410, at least part of the bracket 1410 may contact the array 200.

Due to the contact between the bracket 1410 and the array 200, the adhesive member 1450 is not exposed to the outside.

Figure 15:
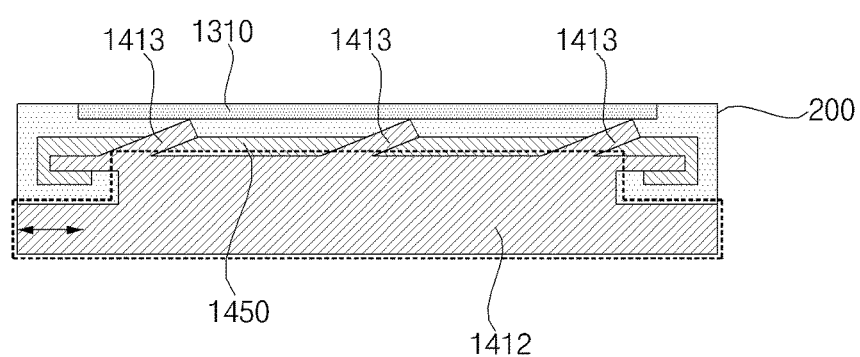
FIG. 15 is a diagram illustrating an example lamp for a vehicle.

FIG. 15 is a diagram for explaining a lamp for a vehicle.

A holder 1413 of the bracket 1410 shown in FIG. 15 may form an acute angle relative to a part of the base 1412.

For example, the holder 1413 may form an acute angle relative to a surface of the base 1412 which faces the array 200.

For example, the holder 1413 may form an acute angle relative to a surface of the base 1412 which faces the first region 1310 of the array 200.

In some examples, the holder 1413 may provide additional support/holding power in addition to the adhesive member 1450. The array 200 may partially cover or wrap around an outer edge of the bracket 1410.

Figure 16:
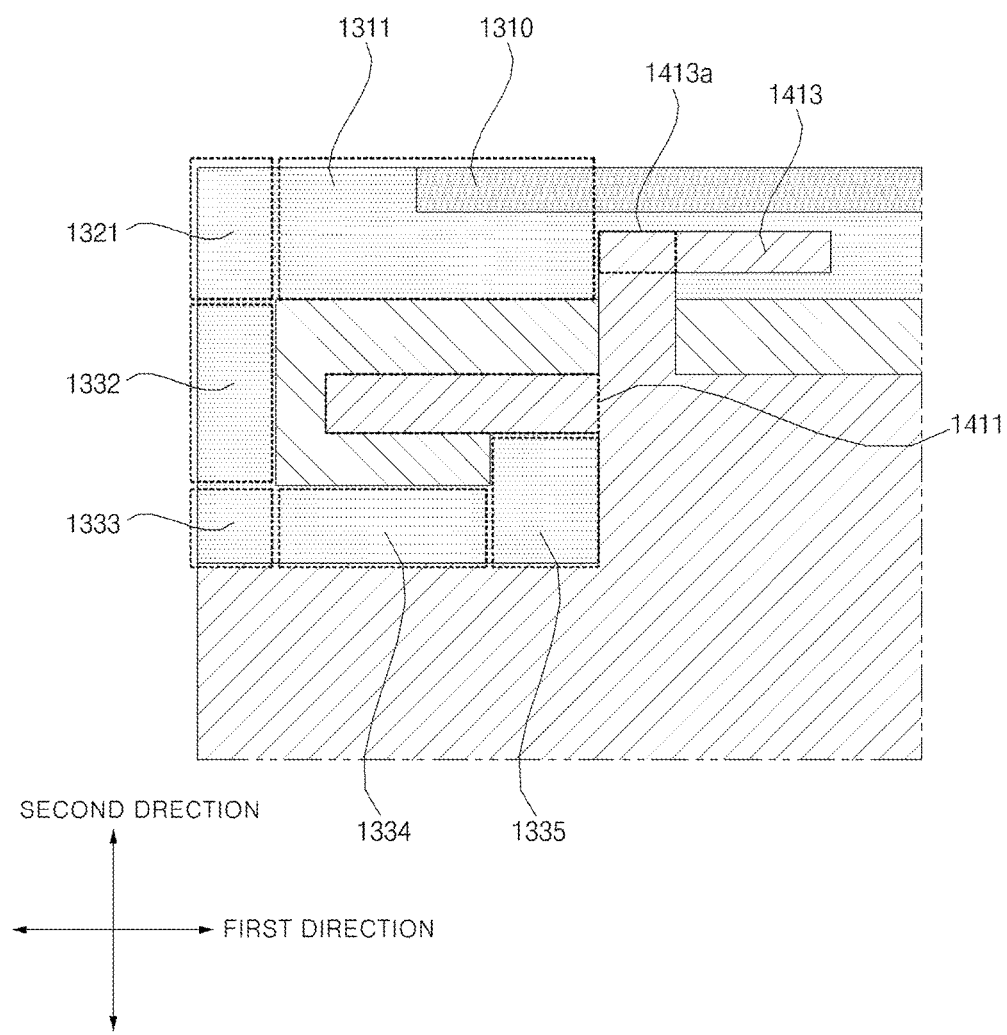
FIG. 16 is an enlarged view of the portion A shown in FIG. 14.

FIG. 16 is an enlarged view of the portion A shown in FIG. 14.

In the following description, a first direction and a second direction may be used for relative orientation. The second direction may be different from the first direction. For example, the second direction may be a direction perpendicular to the first direction.

The first direction and the second direction may differ depending on a light output direction or a position of the array 200.

For example, as illustrated in FIG. 16, when the light generation unit 160 outputs light in a direction perpendicular to a road surface, the first direction may be a horizontal direction and a second direction may be a vertical direction.

In other examples, contrary to the example of FIG. 16, when the light generation unit 160 outputs light in a direction parallel to a road surface, the first direction may be a vertical direction and the second direction may be a horizontal direction.

Referring to FIG. 16, the array 200 may include a plurality of portions to cover or wrap around all or a portion of the bracket 1410 (e.g., a protrusion 1411). For example, the array 200 may include a first flat portion 1311, a first bent portion 1321, a second flat portion 1332, a second bent portion 1333, a third flat portion 1334, and a third bent portion 1335.

The first flat portion 1311 extends in the first direction.

The first flat portion 1311 may include the first region 1310 (see FIGS. 13 and 14).

The first flat portion 1311 may include a plurality of micro LED chips 920 disposed thereon.

The first bent portion 1321 may be bent from the first flat portion in the second direction.

The second flat portion 1332 extends from the first bent portion 1321.

The second bent portion 1333 is bent from the second flat portion 1332 in the first direction.

The third flat portion 1334 extends from the second bent portion 1333 in the first direction.

The third bent portion 1335 extends from the third flat portion 1334 in the second direction.

For example, the fixing portion 1331 described above with reference to FIG. 13 may include the second flat portion 1332, the second bent portion 1333, the third flat portion 1334, and the third bent portion 1335.

As the fixing portion 1331 is formed to surround the protrusion, the array 200 may be tightly fixed to the bracket 1410.

FIG. 17 is a diagram for explaining an example lamp for a vehicle.

Referring to FIG. 17, the second flat portion 1332 may include a light emission region.

The second flat portion 1332 may have some of the plurality of micro LED chips 920 disposed thereon.

In some examples, a portion of the plurality of micro LED chips 920 may be disposed on the second flat portion 1332.

As some of the plurality of micro LED chips 920 are disposed on the second flat portion 1332, it may be possible to output light in the first direction as well as the second direction, thereby enhancing light efficiency.

Figure 18:
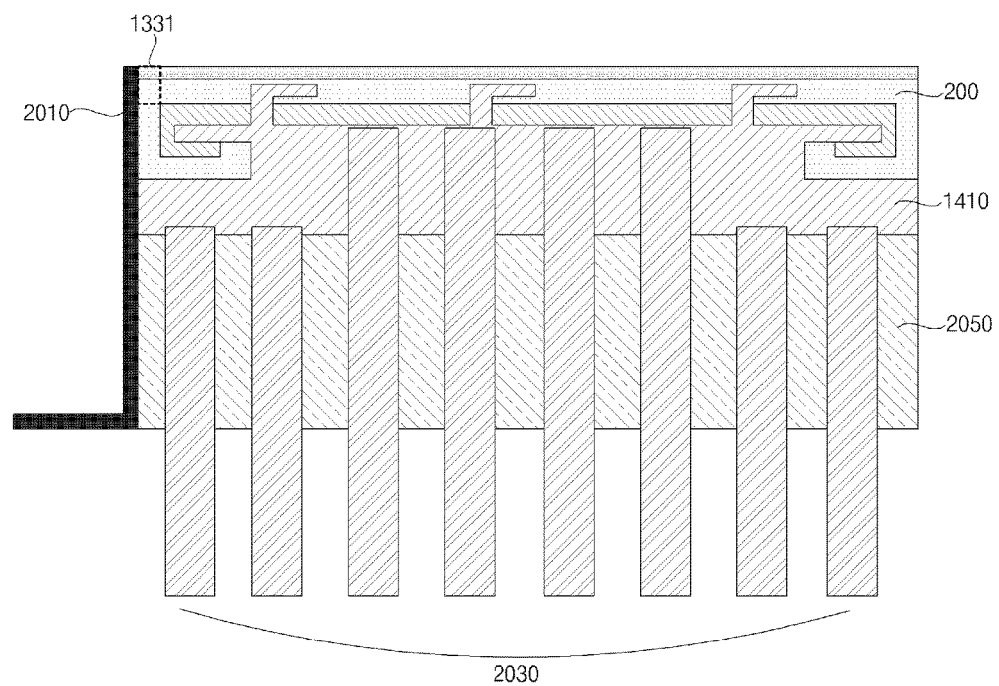
FIG. 18 is a diagram illustrating an example array and an example bracket of a lamp for a vehicle.

FIG. 18 is a diagram for explaining an example lamp for a vehicle.

Referring to FIG. 18, the lamp 100 may further include a wire 2010.

The wire 2010 may include an anode wire and a cathode wire.

The wire 2010 may supply electrical energy to the array 200.

One end of the wire 2010 may be connected to a battery inside a vehicle.

The other end of the wire 2010 may be connected to the array 200.

The array 200 may include at least one bent portions 1321, and the wire 2010 may be connected to the bent portion 1321.

For example, a light emission region included in the array 200 may extend up to the bent portion 1321. In this case, the wire 2010 may be connected to the bent portion 1321 and the light emission region, thereby being enabled to supply electrical energy to the array 200. In this case, the wire 2010 may be connected to the bent portion 1321 and a first electrode 912 of the light emission region to supply electrical energy.

The wire 2010 may contact at least part of the bracket 1410.

For example, the wire 2010 may contact one exterior surface of the bracket 1410.

The lamp 100 may further include a heat dissipation system 2030.

The heat dissipation system 2030 may contact at least part of the bracket 1410.

The heat dissipation system 2320 may manage heat that is generated from the array 200.

The heat dissipation system 2030 may include a plurality of dissipation pins. A dissipation pin may be formed of a material having an excellent thermal conductivity.

The plurality of dissipation pins may penetrate the bracket 1410 to contact the array 200.

In some implementations, the lamp 100 may include a housing.

The housing may define the exterior of the lamp 100. The housing may accommodate constituent elements of the lamp 100.

The plurality of dissipation pins may penetrate the housing. In this case, some of the plurality of dissipation pins may be exposed to the outside of the housing.

The lamp 100 may further include a supporting structure 2050.

The supporting structure 2050 may contact the bracket 1410.

The supporting structure 2050 may press the bracket 1410 toward the array 200. As the supporting structure 2050 presses the bracket 1410 toward the array 200, the array 200 is able to contact the bracket 1410 more closely. In addition, the array 200 is fixed to the bracket 1410 with the fixing portion 1331 embracing the protrusion 1411 of the bracket 1410. In this case, due to the bending of the array 200, the array 200 and the bracket 1410 are not spaced apart from each other.

By allowing the bracket 1410 presses the third flat portion 1334, the supporting structure 2050 may help the array 200 to be fixed to the bracket 1410 more securely.

The supporting structure 2050 may be any of components included in the lamp 100.

The wire 2010 may contact one exterior surface of the supporting structure 2050.

Figure 19:
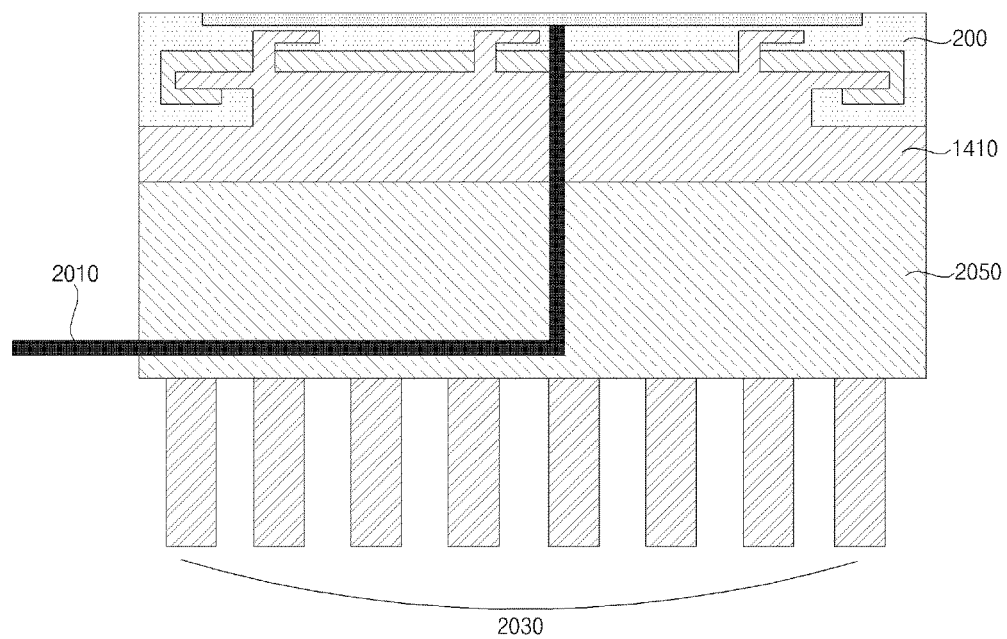
FIG. 19 is a diagram illustrating an example array and an example bracket of a lamp for a vehicle.

FIG. 19 illustrates an example array and an example bracket of a lamp for a vehicle.

Referring to FIG. 19, the wire 2010 may penetrate the inside of the bracket 1410.

The wire 2010 may penetrate the inside of the bracket 1410 to be connected to the array 200.

By penetrating the inside of the supporting structure 2050, the wire 2010 may be connected to the array 200.

As the wire 2010 penetrates the bracket 1410 and the supporting structure 2050 to be connected to the array 200, the wire 2010 may be arranged neatly.

In some implementations, the bracket 1410 and the supporting structure 2050 may have a flat shape as illustrated. In some implementations, the brake 1410 and the supporting structure 2050 may have a curved shape, or a combination of a flat and curved shape. The bracket 1410 and the supporting structure 2050 may be flexible. In examples where the bracket 1410 and the supporting structure 2050 have curve shapes, the array 200 may be bent to curve corresponding to curvatures of the curved shapes of the bracket 1410 and the supporting structure 2050. A curved shape may include a bent shape.

The present disclosure as described above may be implemented as code that can be written on a computer-readable medium in which a program is recorded and thus read by a computer. The computer-readable medium includes all kinds of recording devices in which data is stored in a computer-readable manner. Examples of the computer-readable recording medium may include a hard disk drive (HDD), a solid state disk (SSD), a silicon disk drive (SDD), a read only memory (ROM), a random access memory (RAM), a compact disk read only memory (CD-ROM), a magnetic tape, a floppy disc, and an optical data storage device. In addition, the computer-readable medium may be implemented as a carrier wave (e.g., data transmission over the Internet). In addition, the computer may include a processor or a controller. Thus, the above detailed description should not be construed as being limited to the implementations set forth herein in all terms, but should be considered by way of example. The scope of the present disclosure should be determined by the reasonable interpretation of the accompanying claims and all changes in the equivalent range of the present disclosure are intended to be included in the scope of the present disclosure.

Although implementations have been described with reference to a number of illustrative implementations thereof, it should be understood that numerous other modifications and implementations can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lamp for a vehicle, comprising:
    a light generation unit;
    a bracket; and
    a lens configured to change an optical path of light generated by the light generation unit,
    wherein the light generation unit comprises a light array including a plurality of micro Light Emitting Diode (LED) chips, and
    wherein the light array includes a bent portion that covers at least a part of the bracket, and
    wherein the light array comprises a plurality of portions to cover the at least a part of the bracket, the plurality of portions of the light array including:
        a first flat portion that extends in a first direction, and
        a first bent portion that extends from the first flat portion in a second direction.

2. The lamp according to claim 1, wherein the light array is configured to flex.

3. The lamp according to claim 1, wherein the light array comprises:
    a first region that includes the plurality of micro LED chips; and
    a second region that does not include the plurality of micro LED chips, and
    wherein at least a portion of the second region has a bent shape.

4. The lamp according to claim 1, wherein the bracket comprises:
    a base; and
    a holder that extends from the base toward the light array and that is configured to fix the light array to the holder.

5. The lamp according to claim 4, wherein the holder comprises one or more bent portions.

6. The lamp according to claim 4, wherein the holder extends from the base in a direction that forms an acute angle with respect to a surface of the base.

7. The lamp according to claim 4, wherein the light array comprises a bent region having a preset curvature, and
    wherein the holder is disposed at a location corresponding to the bent region of the light array.

8. The lamp according to claim 4, further comprising an adhesive member configured to couple the light array to the bracket.

9. The lamp according to claim 4, wherein the at least a portion of the bracket contacts the light array.

10. The lamp according to claim 1, further comprising a wire configured to supply electrical energy to the light array, the wire contacting the at least a portion of the bracket.

11. The lamp according to claim 10, wherein the light array comprises at least one bent portion that is connected to the wire.

12. The lamp according to claim 1, further comprising a heat dissipation device that contacts at least a portion of the bracket and that is configured to dissipate heat generated from the light array.

13. The lamp according to claim 12, wherein the heat dissipation device comprises a plurality of dissipation pins that penetrates the bracket to thereby contact the light array.

14. The lamp according to claim 13, further comprising a housing that defines an exterior of the lamp,
    wherein the plurality of dissipation pins are exposed to an outside of the housing.

15. The lamp according to claim 1, wherein the light array further comprises:
    a second flat portion that extends from the first bent portion in the second direction; and
    a second bent portion that extends from the second flat portion in the first direction.

16. The lamp according to claim 15, wherein the light array further comprises:
    a third flat portion that extends from the second bent portion in the first direction; and
    a third bent portion that extends from the third flat portion in the second direction.

17. The lamp according to claim 15, wherein the second flat portion includes a portion of the plurality of micro LED chips.

18. The lamp according to claim 1, further comprising a supporting structure that contacts the bracket and that is configured to provide pressure to the bracket toward the light array.

19. The lamp according to claim 18, further comprising a wire configured to supply electrical energy to the light array, the wire penetrating the bracket and the supporting structure.

* * * * *